United States Patent
Berman et al.

(10) Patent No.: US 12,331,394 B2
(45) Date of Patent: Jun. 17, 2025

(54) METHOD OF FORMING POROUS INORGANIC FILMS VIA POLYMER SWELLING INFILTRATION

(71) Applicants: UNIVERSITY OF NORTH TEXAS, Dallas, TX (US); UCHICAGO ARGONNE, LLC, Chicago, IL (US); THE UNIVERSITY OF CHICAGO, Chicago, IL (US)

(72) Inventors: Diana Berman, Dallas, TX (US); Elena V. Shevchenko, Chicago, IL (US); Supratik Guha, Chicago, IL (US)

(73) Assignee: UNIVERSITY OF NORTH TEXAS, Dallas, TX (US)

( * ) Notice: Subject to any disclaimer, the term of this patent is extended or adjusted under 35 U.S.C. 154(b) by 0 days.

(21) Appl. No.: 18/357,114

(22) Filed: Jul. 22, 2023

(65) Prior Publication Data
US 2024/0026528 A1    Jan. 25, 2024

Related U.S. Application Data

(60) Provisional application No. 63/391,614, filed on Jul. 22, 2022.

(51) Int. Cl.
| | | |
|---|---|---|
| C23C 16/04 | (2006.01) | |
| C23C 16/01 | (2006.01) | |
| C23C 16/06 | (2006.01) | |

(52) U.S. Cl.
CPC ............ C23C 16/045 (2013.01); C23C 16/01 (2013.01); C23C 16/06 (2013.01)

(58) Field of Classification Search
CPC ........ C23C 16/045; C23C 16/01; C23C 16/06
See application file for complete search history.

(56) References Cited

U.S. PATENT DOCUMENTS

| | | | | |
|---|---|---|---|---|
| 4,022,927 A * | 5/1977 | Pfeiffer | ............... | G03F 1/20 430/394 |
| 6,482,299 B1 * | 11/2002 | Inganas | ............... | H01B 1/128 429/492 |
| 2008/0226684 A1 * | 9/2008 | Peppas | ............... | A61K 9/0004 521/61 |
| 2009/0081265 A1 * | 3/2009 | Peppas | ............... | A61K 9/7007 426/89 |
| 2012/0171805 A1 * | 7/2012 | Hu | ............... | H01L 31/068 257/E31.001 |
| 2017/0229593 A1 * | 8/2017 | Elam | ............... | F24S 70/225 |
| 2018/0375149 A1 * | 12/2018 | Beck | ............... | H01M 10/0562 |
| 2019/0017166 A1 * | 1/2019 | Shevchenko | ............... | G02B 1/118 |
| 2019/0163064 A1 * | 5/2019 | Ohashi | ............... | H01L 21/308 |
| 2020/0395584 A1 * | 12/2020 | Gardner | ............... | H01M 4/48 |
| 2020/0406235 A1 * | 12/2020 | Berman | ............... | B01J 21/04 |
| 2022/0158179 A1 * | 5/2022 | Hermann | ............... | H01M 4/382 |

FOREIGN PATENT DOCUMENTS

KR    10-1180305    *    8/2012    .............. G03G 9/08

OTHER PUBLICATIONS

Berman, Diana, et al., "Sequential Infiltration Synthesis for the Design of Low Refractive Index Surface Coatings with Controllable Thickness". ACS Nano 2017, 11, 2521-2530.*
Pleshek, Daniel, et al., "Swelling-Assisted Sequential Infiltration Synthesis of Nanoporous ZnO Films with Highly Accessible Pores and Their Sensing Potential for Ethanol". ACS Appl. Mater. Interfaces 2021, 13, 35941-35948.*
Mei, Shilin, et al., "Polymer nanofibers by controllable infiltration of vapour swollen polymers into cylindrical nanopores". Soft Matter, 2013, 9, 945-951.*
Ehrenhofer, Adrian, et al., "Normalization of hydrogel swelling behavior for sensoric and actuatoric applications". Sensors and Actuators B: Chemical, 255 (2018) 1343-1353.*
Del Rey, Mercedes, et al., "Monitoring swelling and deswelling of thin polymer films by microcantilever sensors". Sensors and Actuators B: Chemical, 204 (2014) 602-610.*
Gravert, Dennis J., et al., "Organic Synthesis on Soluble Polymer Supports: Liquid Phase Methodologies". Chem. Rev. 1997, 97, 489-509.*

* cited by examiner

*Primary Examiner* — Bret P Chen
(74) *Attorney, Agent, or Firm* — Andrew M. Metrailer; James Ruland; Conley Rose, P.C.

(57) ABSTRACT

A method of forming an inorganic film on a surface can include depositing a polymer at a layer on a surface, swelling the polymer with a solvent to produce a swollen polymer on the surface, infiltrating the swollen polymer with a precursor, removing the swollen polymer after infiltrating the swollen polymer with the precursor, and forming a porous inorganic film on the surface based on removing the swollen polymer.

15 Claims, 9 Drawing Sheets

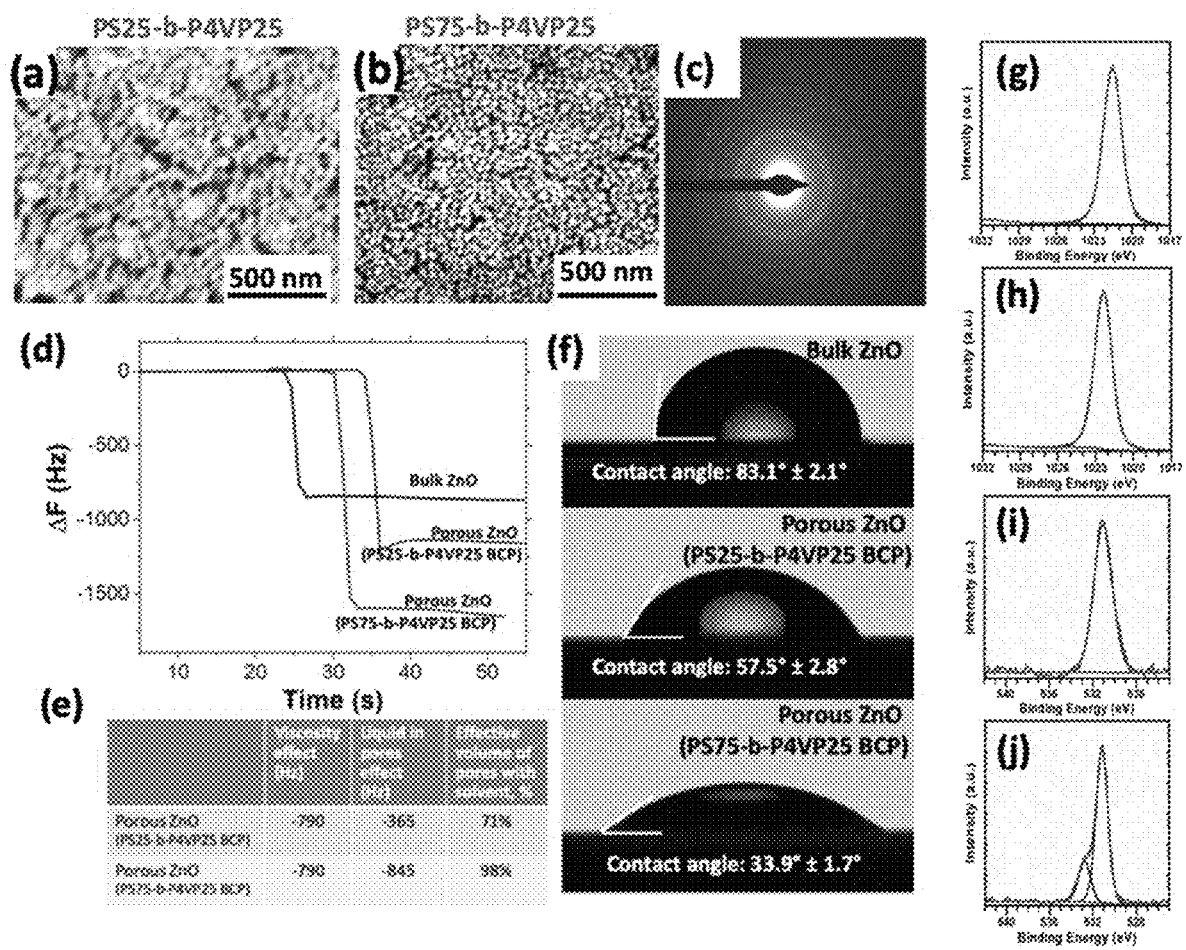
FIGS. 3a-j

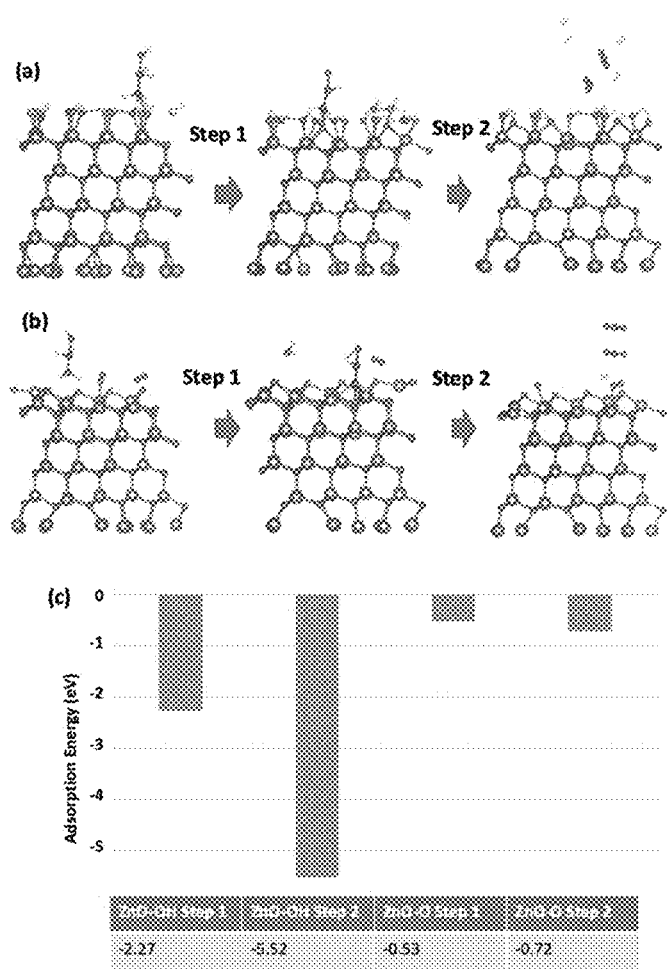
FIGS. 4a-c

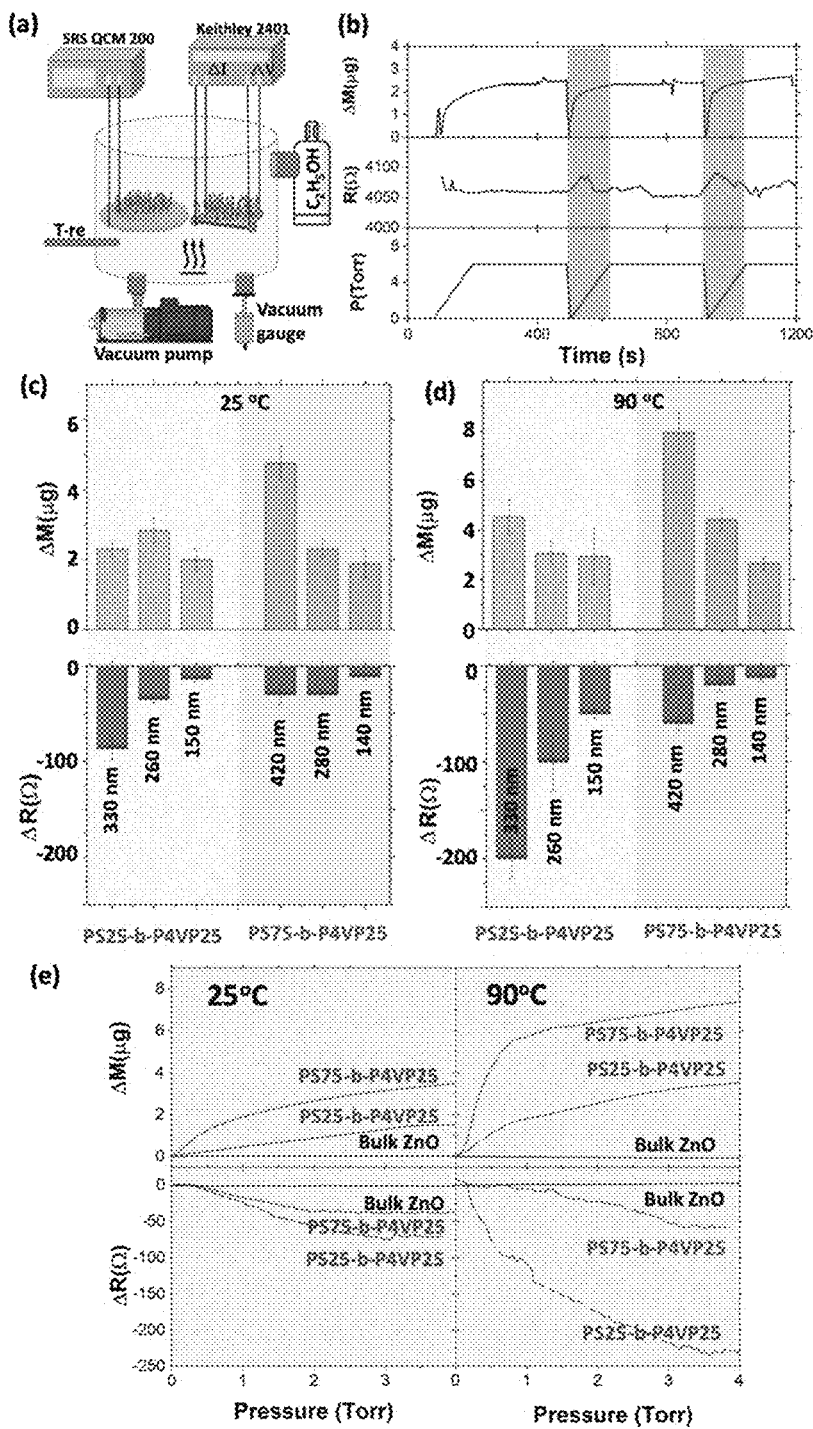
FIGS. 5a-e

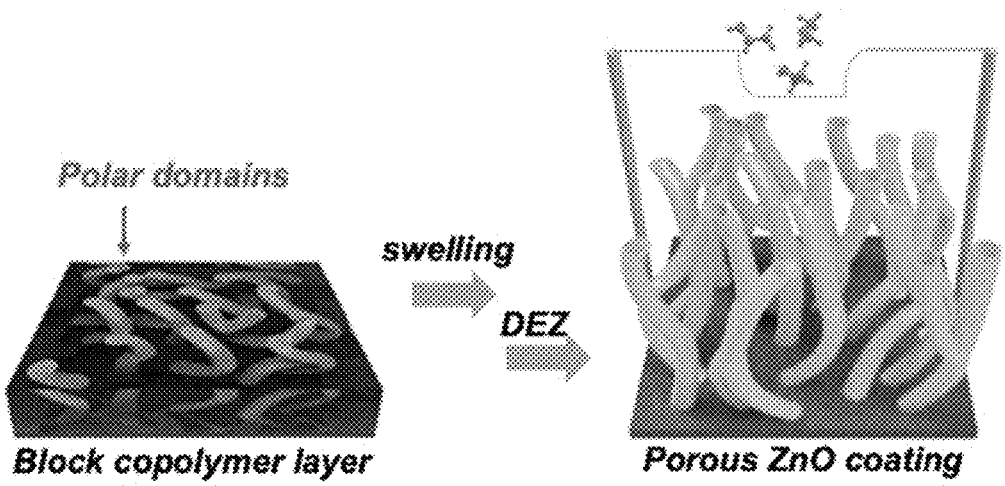
FIG. 6
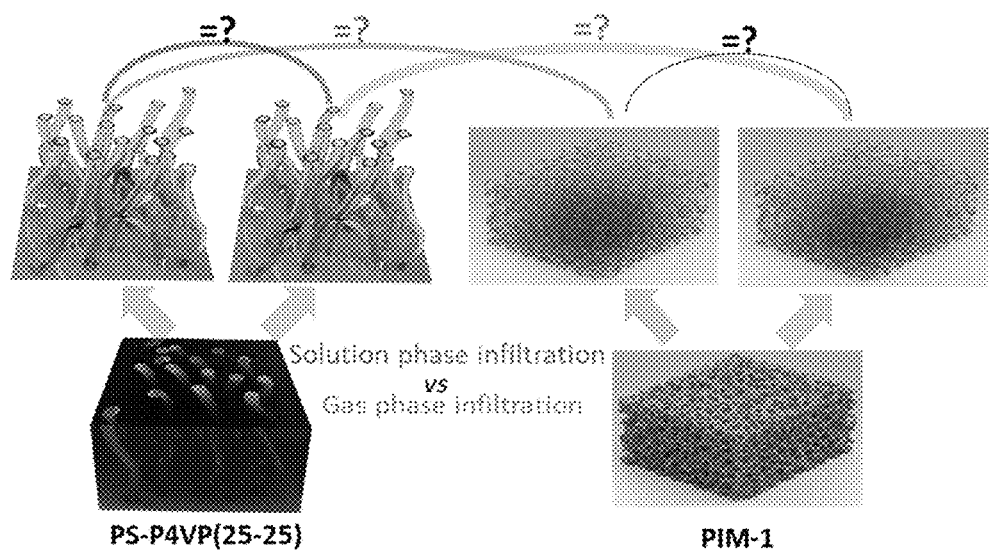
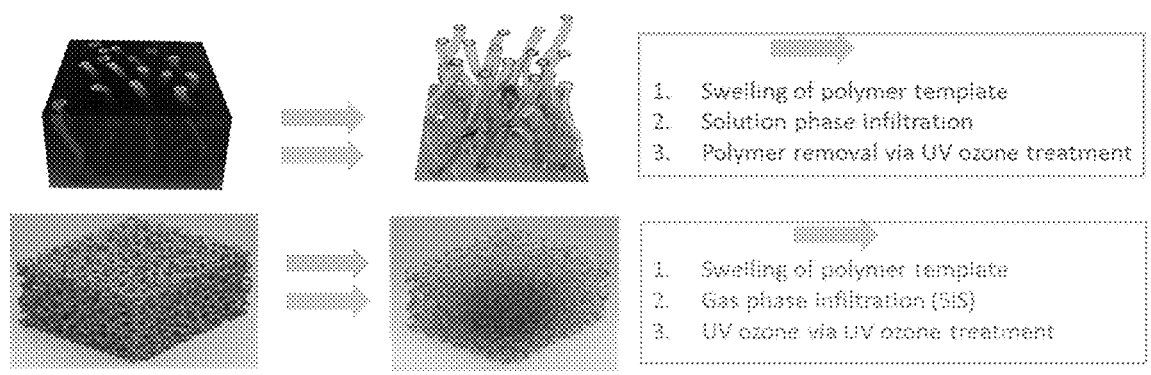
FIG. 7

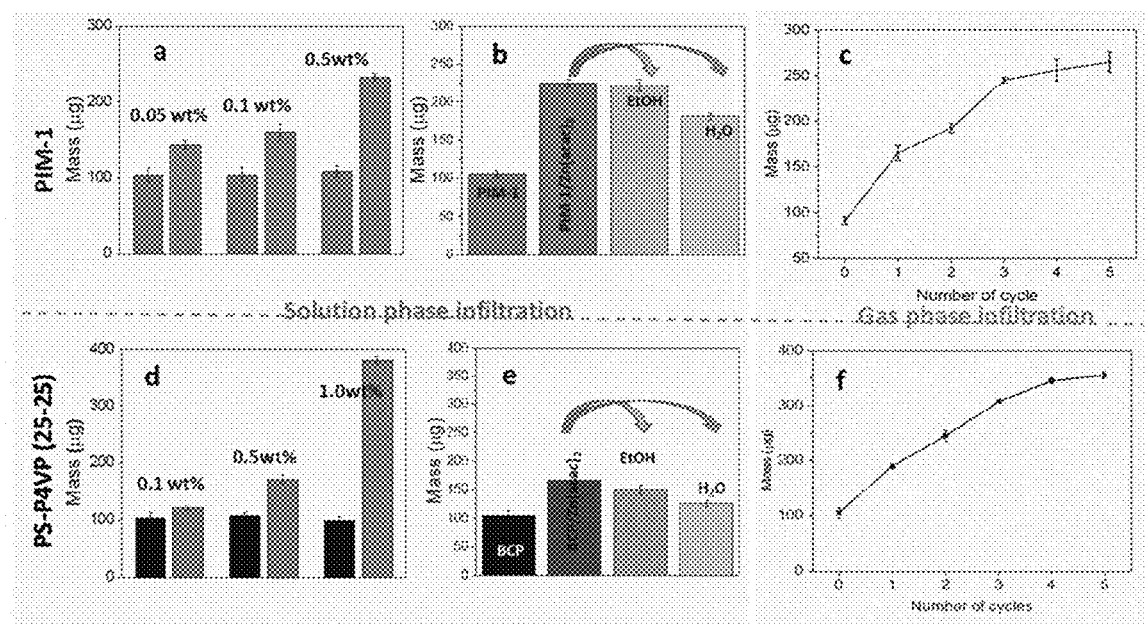
FIGS. 8a-f
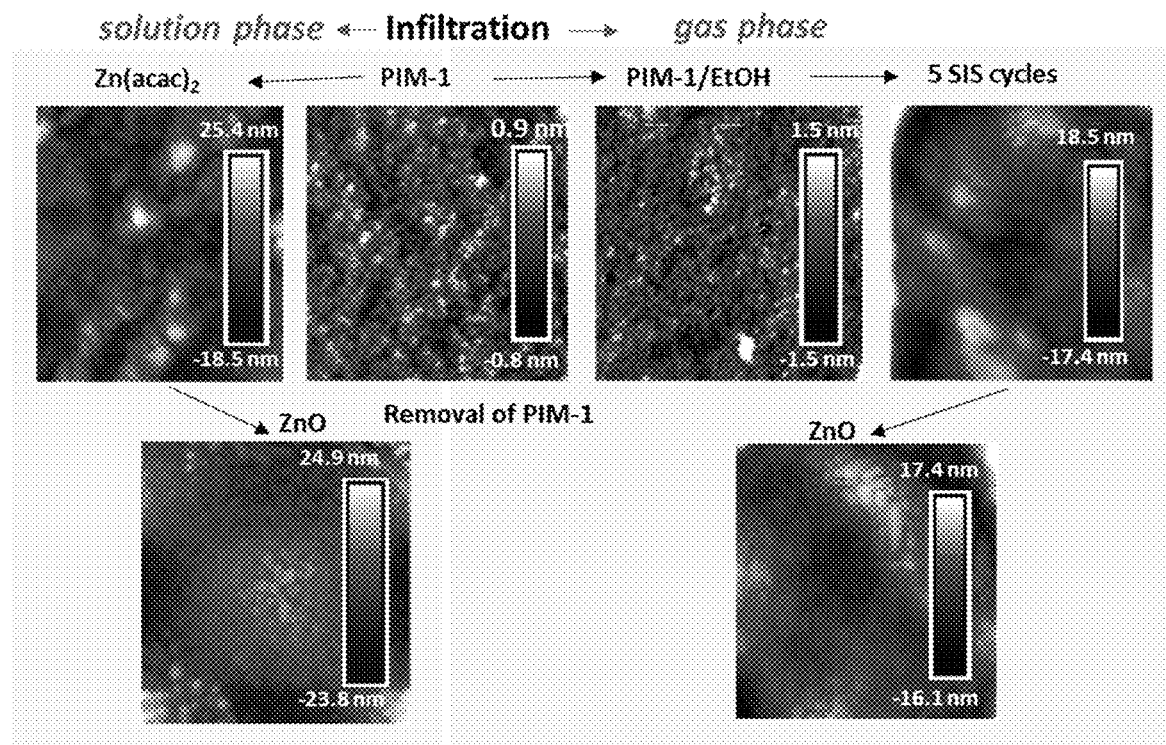
FIG. 9

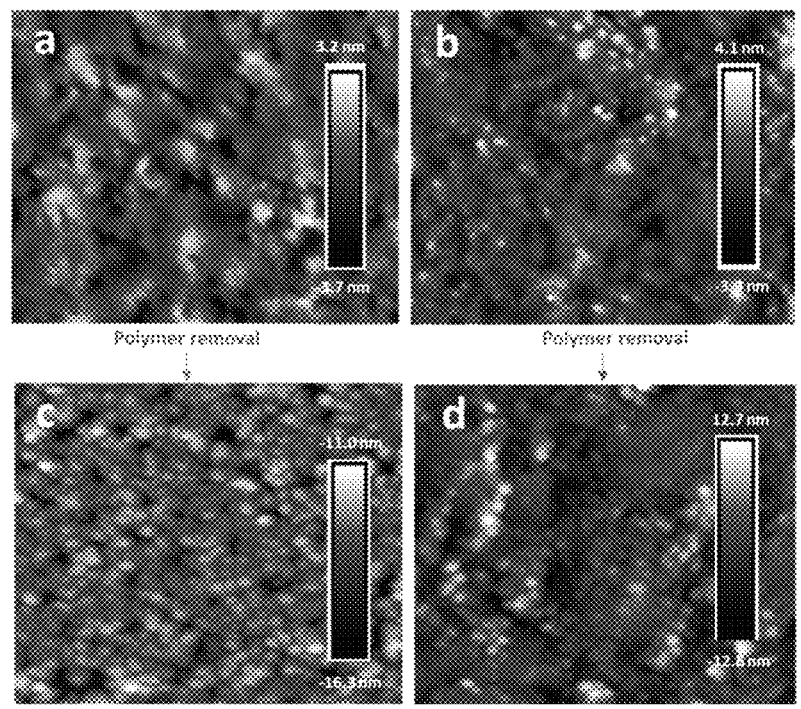
FIGS. 10a-d
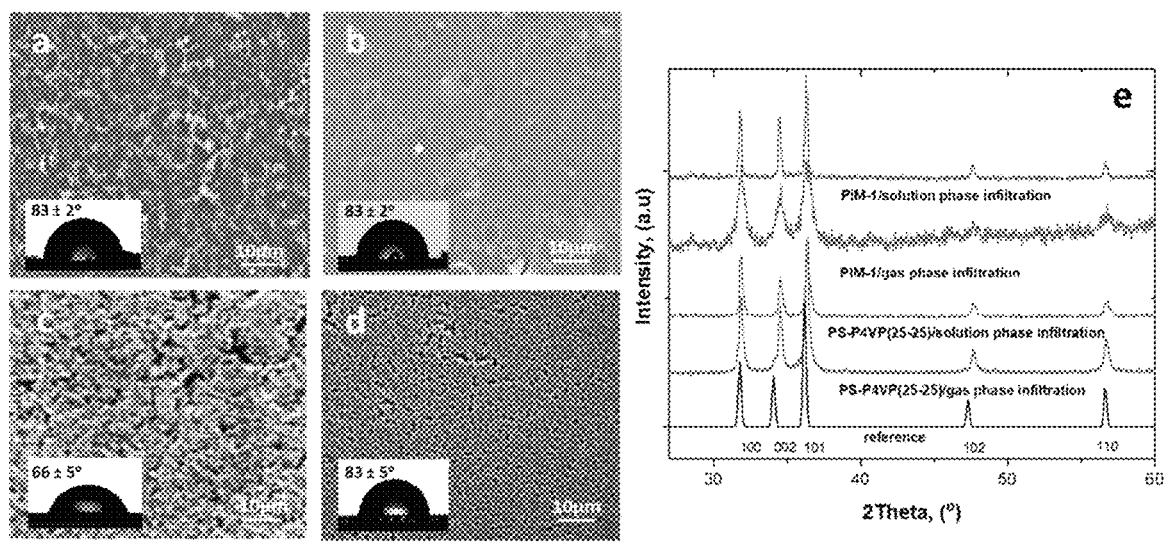
FIGS. 11a-e

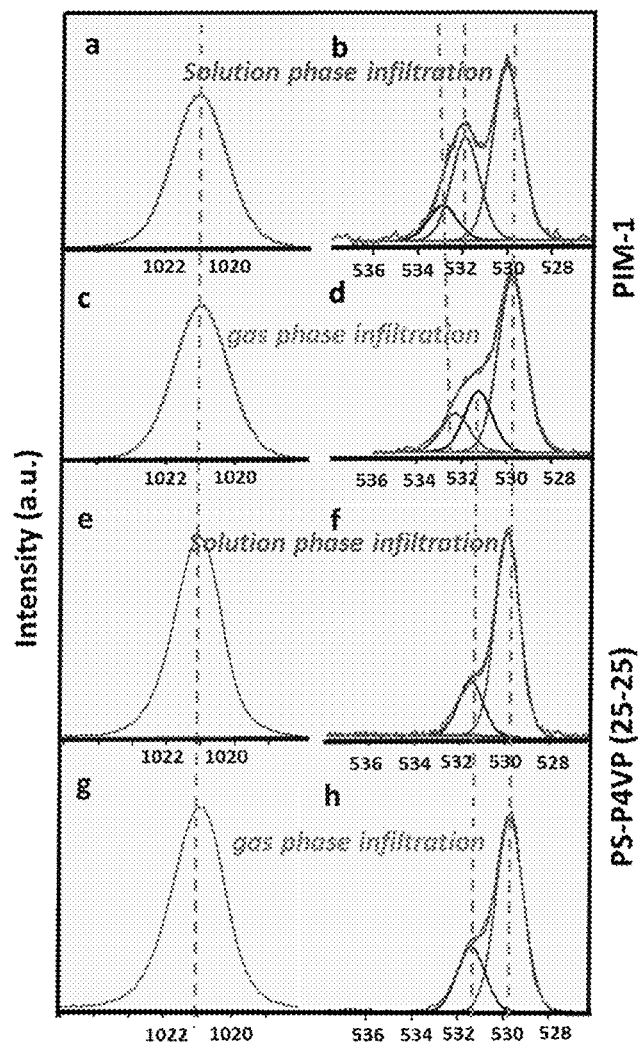
FIGS. 12a-h

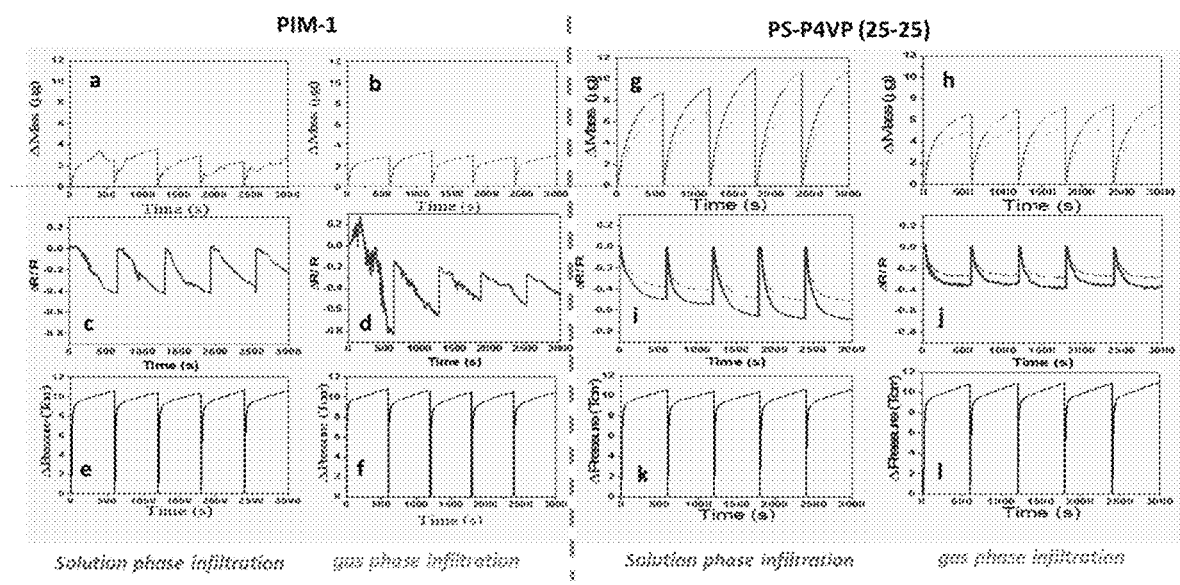
FIGS. 13a-l

METHOD OF FORMING POROUS INORGANIC FILMS VIA POLYMER SWELLING INFILTRATION

CROSS-REFERENCES TO RELATED APPLICATIONS

This application claims the benefit of U.S. Provisional Application No. 63/391,614, filed on Jul. 22, 2022, and entitled "Porous Inorganic Films Via Polymer Swelling Infiltration," which is incorporated herein by reference in its entirety for all purposes.

STATEMENT REGARDING FEDERALLY SPONSORED RESEARCH OR DEVELOPMENT

This invention was made with government support under Award No. ECCS 2045662 awarded by the National Science Foundation, and the U.S. Department of Energy, Office of Science, Office of Basic Energy Sciences, under Contract No. DE-AC0206CH-11357. The government has certain rights in the invention.

BACKGROUND

The urge for clean air, preservation of the environment, and non-invasive diagnostics emphasizes the importance of analytical systems capable of selective and sensitive analysis of gases in industrial, residential, and medical settings. Metal oxide semiconductors can be used as major sensing components for the detection of various gas molecules with good selectivity and fast and high response signal. Detection of the gases in such sensors bases on the changes in mass, electrical, or electrochemical properties of the metal oxide upon contact with sensed species. The sensing layer based on metal oxide semiconductor materials is usually fabricated in a form of a film. Such films can be deposited either from chemically synthesized nanoparticles via dip coating, sol-gel processing, and hydrothermal synthesis, or directly by chemical vapor deposition, RF magnetron sputtering, electrospinning, angle deposition, molecular beam epitaxy, metal-organic chemical vapor deposition, or atomic layer deposition (ALD). Among other metal oxides, zinc oxide (ZnO) offers very high thermal and chemical stability that makes it a commonly used material systems in gas sensors.

SUMMARY

In some embodiments, a method of forming an inorganic film on a surface can include: depositing a polymer at a layer on a surface; swelling the polymer with a solvent to produce a swollen polymer on the surface; infiltrating the swollen polymer with a precursor; removing the swollen polymer after infiltrating the swollen polymer with the precursor; and forming a porous inorganic film on the surface based on removing the swollen polymer.

In some embodiments, a sensor comprises a porous inorganic film disposed on a surface, wherein the porous inorganic film comprises zinc oxide, and one or more sensor leads in electrical contact with the porous inorganic film.

These and other features will be more clearly understood from the following detailed description taken in conjunction with the accompanying drawings and claims.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

FIGS. 3a-b are scanning electron microscope (SEM) images of embodiments of the films grown using, respectively, 150 nm PS25-b-P4VP25 and 140 nm PS75-b-P4VP25 BCP templates.

FIG. 3c is a pictorial depiction of an embodiment of an electron diffraction performed on porous ZnO films synthesized via swelling-assisted SIS.

FIG. 3d is a graphical depiction of embodiments of pore accessibility and wetting characteristics of nanoporous ZnO films obtained from 260 nm thick PS25-b-P4VP25 BCP and 280 nm thick PS75-b-P4VP25 BCP.

FIG. 3e is a table depiction of properties of embodiments of delta frequency change upon immersion in water of the QCMs modified with porous and continuous (bulk) ZnO conformal coatings.

FIG. 3f are pictorial depictions of embodiments of estimated amounts of water filling pores.

FIGS. 3g-j are graphical depictions of embodiments of water contact angle data on the nanoporous ZnO film and bulk ZnO film. X-ray photoelectron spectroscopy (XPS) analysis of Zn2p and O1s peaks for atomic layer deposition (ALD) ZnO (as depicted in FIGS. 3g-h) and SIS ZnO (as depicted in FIGS. 3i-j). The continuous "bulk" ZnO films are obtained via 500 cycles of ALD deposition.

FIGS. 4a-c are schematic depictions of embodiments summarizing the density functional theory (DFT) calculations results of OH-terminated ZnO surface reacting with ethanol molecules (as depicted in FIG. 4a), ZnO surface without OH groups reacting with ethanol molecules (as depicted in FIG. 4b), and adsorption energy calculations indicating higher preferentiability for the reaction with ethanol to proceed in the case of the OH-terminated surface of ZnO (as depicted in FIG. 4c).

FIG. 5a is a schematic depiction of an embodiment of a setup used in chemiresistive and QCM tests.

FIGS. 5b-e are graphical depictions of embodiments of change in adsorption mass and resistance as a function of time upon introducing ethanol for 260 nm thick porous ZnO obtained using PS25-b-P4VP25 BCP at room temperature (as depicted in FIG. 5b), simultaneous measurements of QCM mass changes and changes in the electrical conductivity (as depicted in FIGS. 5c-d) of the ZnO films upon introduction of 4 Torr of ethanol vapors at room temperature (as depicted in FIG. 5c) and at 90° C. (as depicted in FIG. 5d), and the thicknesses for the porous ZnO films are provided on the graphs (as depicted in FIG. 5e). Evolution of the mass and resistivity change for ZnO films are obtained using 330 nm and 420 nm PS25-b-P4VP25 and PS75-b-P4VP25 templates upon their exposure to ethanol vapors.

FIG. 6 is a diagram of an embodiment depicting a block copolymer layer during swelling and infiltration with zinc oxide processes to form a porous ZnO coating.

FIG. 7 is diagram of embodiments depicting polymer templates and the approaches used in the synthesis of porous ZnO structures.

FIGS. 8a-f are graphical depictions of embodiments of mass changes of the polymer templates as a result of their infiltration with zinc oxide precursors measured by the QCM. Mass increase are caused by the infiltration of PIM-1 and PS-P4VP templates (respectively, FIG. 8a and FIG. 8d), where the masses of PIM-1 and PS-P4VP deposited for each experiment are shown in FIG. 8a and FIG. 8d are depicted as gray and black bars, correspondingly, using solution-phase precursor with different concentrations of $Zn(acac)_2$ in ethanol (the concentration used in the experiments are denoted on the figures); (FIG. 8b and FIG. 8e) evolution of the mass of PIM-1 and PS-P4VP templates infiltrated with 0.5 weight percent (wt. %) of $Zn(acac)_2$ upon their exposures to EtOH and H2O; and (FIG. 8c) evolution of the mass of PIM-1 and PS-P4VP templates as a result of 1-5 SIS cycles (the polymer templates are treated with EtOH prior SIS as described below).

FIG. 9 are pictorial depictions of embodiments of AFM surface topography images of initial PIM-1 and PIM-1 templates underwent infiltration with zinc oxide precursors from solution and gas phases followed by polymer removal resulting in the formation of porous ZnO coatings. The AFM scan size is 140 nm.

FIGS. 10a-d are pictorial depictions of embodiments of AFM surface topography images of BCP (PS-b-P4VP(25-25)) templates infiltrated using solution (1 wt. % of $Zn(acac)_2$ in EtOH) and gas-phase precursors (FIG. 10a and FIG. 10b, respectively) and AFM surface topography images of porous ZnO coatings formed as a result of polymer removal of PS-P4VP templates infiltrated using solution and gas-phase precursors (FIG. 10c and FIG. 10d, respectively). The AFM scan size is 140 nm.

FIGS. 11a-d are pictorial depictions of embodiments of SEM images of porous ZnO coatings obtained using PIM-1 templates with solution and gas-phase precursors, (FIG. 11a and FIG. 11b, respectively), and using BCP (PS-b-P4VP(25-25) templates with solution and gas precursors (FIG. 11c and FIG. 11d, respectively). Amounts of 0.5 wt. % and 1 wt. % concentrations of $Zn(acac)_2$ in EtOH are used for PIM-1 and PS-b-P4VP(25-25) templates, respectively. Five cycles of SIS are used for the infiltration of polymer templates with gas-phase precursors. The insets demonstrate the data of the contact angle measurements on the corresponding surfaces.

FIG. 11e is a pictorial depiction of embodiments of XRD spectra of porous ZnO film synthesized by infiltration of PIM-1 and PS-b-P4VP(25-25) templates using the solution and gas-phase precursors.

FIGS. 12a-h are pictorial depictions of embodiments of XPS spectra of Zn $2p_{3/2}$ and O is peaks for porous ZnO coatings synthesized with PIM-1 and PS-P4VP(25-25).

FIGS. 13a-l are pictorial depictions of embodiments of summary of change in mass and resistance upon the exposure of porous ZnO synthesized using different polymer templates and precursors to ethanol vapor at room temperature. FIGS. 13a-d and FIGS. 13g-j correspond to ZnO samples synthesized using PIM-1 and PS-P4VP, respectively. The pressure profiles for each experiment are shown in FIG. 13e, FIG. 13f, FIG. 13k, and FIG. 13l.

For a more complete understanding of the present disclosure and the advantages thereof, reference is now made to the following brief description, taken in connection with the accompanying drawings and detailed description, wherein like reference numerals represent like parts.

DETAILED DESCRIPTION

Figure 1A:
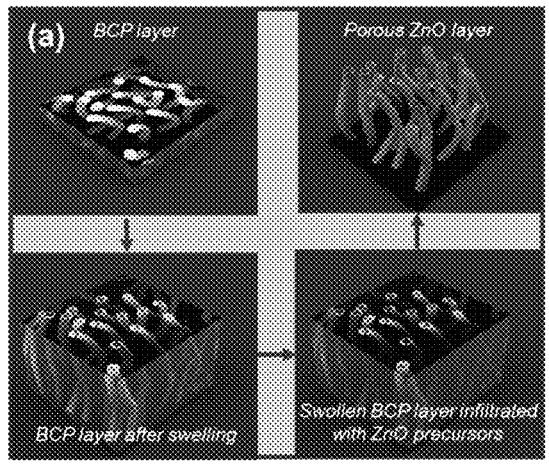
FIG. 1a is a schematic of an embodiment of a swelling-assisted SIS process enabling deposition of nanoporous ZnO films.

Template-assisted infiltration synthesis has been efficiently used for creating composite and all-inorganic nanoporous metal oxide structures. Organic polymers can be exposed to gas phase metalorganic precursors (so-called sequential infiltration synthesis (SIS) or vapor phase infiltration (VPI)) or metal ions dissolved in solution to transform them into hybrid materials. Polymer templates can be further removed via thermal oxidative annealing or plasma treatment resulting in the synthesis of all-inorganic metal oxides architectures with features resembling the structure of the polymer. All polymers with functional groups capable of interacting with gas or solution phase metal precursors can be used to synthesize hybrid or all-inorganic structures for a broad range of applications such as solvent separation membranes, reusable absorbers for oil spill mitigation, sensors and antireflective coatings.

Various polymer templates such as block copolymers (BCPs) consisting of polar and nonpolar domains (e.g. polystyrene-block-polyvinyl pyridine (PS-b-P4VP), PS-b-P2VP, polystyrene-block-polymethylmethacrylate (PS-b-PMMA), etc.), polymers that carry polar groups (e.g. UV-curable photoresists SU-8 or polymethylmethacrylate) and polymers of intrinsic microporosity (PIM) have been utilized as templates in SIS. The use of BCPs and PIM as templates allows to engineer porous hybrids that can further transform into porous all-inorganic structures after polymer removal. However, the mechanism of interactions of BCPs and PIMs with gas-phase precursors seems to be different. In the case of BCP, the gas phase precursors (e.g. trimethylaluminum (TMA)) interact with polar groups (e.g. carbonyl groups) of the hydrophilic part of the BCP, forming physisorbed complexes and covalently bonded products. In turn, PIMs have porous structure with a pore size less than 2 nm, originating from rigid backbones which inhibit efficient molecular chain packing. In the case of PIMs, metal precursors interact with functional groups of PIMs (e.g. C≡N groups) forming an adduct that transforms into hydroxide upon its exposure to $H_2O$ that detaches from the polymer and further serves as a nucleation center for growth of oxide phase. The same gas or solution phase metal oxide precursors and synthesis regimes can be used for the synthesis of porous metal oxides using BCPs and PIMs templates. Understanding how the template affects the properties of the synthesized materials has been challenging.

However, turning to chemiresistive ZnO-based gas sensors, these sensors generally require the heating of the sensing layer to a high temperature (200-500° C.), leading to high energy consumption and changes in the nanomaterial microstructure. Despite the long history of the practical application of ZnO for sensing of ethanol, acetone, etc., the mechanism responsible for the change in resistivity in chemiresistive ZnO is still under debate, it is generally accepted that high temperature is needed to displace the chemisorbed molecules of oxygen and oxidized ethanol. Multiple efforts have been explored to lower the operating temperature requirements. Among them, doping of ZnO and its interfacing with different materials are the most common approaches. ZnO is also used as a sensing layer in adsorption/absorption mass-based sensors that can operate at room temperature but is less cost-efficient as compared to chemiresistive sensors.

In some embodiments, polymer templates are used in the synthesis of all-inorganic metal oxide architectures with features resembling the structure of the polymer. The synthesis of nanoporous metal oxide structures via infiltration of polymer are described herein. Using quartz crystal microbalance (QCM), X-ray diffraction, and X-ray photoelectron spectroscopy analyses, the effect of polymer template and the form of the metal oxide precursors on the properties of synthesized metal oxide can be illustrated. Using a synthesis of ZnO as a model system, the infiltration of polymers can have different mechanisms of interaction with metal oxide precursors such as a polymer of intrinsic microporosity (PIM-1) and representative of the block-copolymers family (e.g., polystyrene-polyvinyl pyridine block copolymer) with gas (e.g., diethyl zinc, DEZ, and water vapors) and solution (e.g., zinc acetylacetonate, $Zn(acac)_2$, dissolved in ethanol) phase precursors. The infiltration of polymer templates can be efficiently achieved using both gas phase and solution phase precursors. The crystallinity of the synthesized ZnO can be mainly affected by the state of the precursor (gas or solution phase) and does not depend on the polymer template type; however, the XPS results show the correlation between the type of polymer template and the surface termination of ZnO. The surface of porous ZnO synthesized with BCP (here as an example PS-P4VP) can be more easily accessible than the surface of ZnO synthesized with PIM; however, despite the lower surface accessibility for ethanol molecules, ZnO synthesized via infiltration of PIM-1 with solution-phase precursors demonstrates the largest change in resistivity upon its exposure to ethanol vapor at room temperature.

In some embodiments, a swelling-assisted SIS approach can be designed for porous zinc oxide films by infiltration of block copolymer templates such as PS-b-P4VP with inorganic precursors followed by UV ozone-assisted removal of the polymer template. The porous ZnO coatings can have a thickness in a range between about 140 nm and about 420 nm obtained using only 5 cycles of SIS. The pores in ZnO fabricated via swelling-assisted SIS are highly accessible and up to 98% of pores are available for solvents penetration. The XPS data indicate that the surface of nanoporous ZnO films can be terminated with —OH groups. DFT calculations show lower energy barrier for ethanol-induced release of oxygen restricted depletion layer in case of the presence of —OH groups at the ZnO surface and hence can lead to higher sensitivity in sensing of ethanol. The response of ZnO porous coatings can be monitored with different thicknesses and porosities to ethanol vapors using combined mass-based and chemiresistive approaches at room temperature and 90° C. The porous ZnO conformal coatings can reveal a sensitivity toward detection of ethanol at low temperature sensitivity. The results suggest the excellent potential of the SIS approach for the design of conformal ZnO coatings with controlled porosity, thickness, and composition that can be adapted for sensing applications.

In some embodiments, representatives of two classes of polymers such as BCPs and PIMs are reportedly to have a different mechanism of interaction with gas-phase metal oxide precursors to effect the polymer template in the synthesis of highly porous ZnO nanostructures. ZnO nanostructures and conformal coating represent an important class of materials with great potential in photocatalysis, gas sensing, biochemical sensing, and fabrication of antibacterial coating. Because ZnO porous structures can be obtained by infiltration of the polymer template with metal precursors from the gas and solution phase, the infiltration technique can affect the synthesized materials. There exists a relationship between the preparation techniques, the structure, and the properties of porous ZnO coatings. Because ZnO is one of the most exploited metal oxides in gas sensing, the sensitivity of ZnO to ethanol vapors can characterize the performance of ZnO synthesized using BCP (PS-P4VP(25-25)) and PIM (PIM-1) templates and two different infiltration techniques with gas phase and solution-based precursors.

Improvement in the gas sensing sensitivity is usually associated with high surface area availability. Nanostructured materials with a high surface area characterized by enhanced gas sensing properties and hence fabrication of nanostructured (e.g., nanoporous) conformal coatings can progress in the design of sensing materials both for chemiresistive and mass-based sensors. Highly porous ZnO uniform conformal coatings with controlled porosity and thickness and uniformity can be synthesized using the infiltration of block copolymer matrix via SIS. The ethanol sensing capabilities of the resulting films can be compared by the quartz crystal microbalance (QCM) adsorption results to the resulting changes in the electrical conductance of the materials at room temperature and 90° C. The results can demonstrate the high sensitivity of the films to the reducing environment of ethanol, even at low temperatures, thus suggesting the excellent potential of SIS-designed ZnO for sensing applications.

Disclosed herein is a swelling-assisted SIS approach for the design of highly porous metal oxide films (e.g., zinc oxide films) by infiltration of block copolymer templates such as PS-b-P4VP with inorganic precursors followed by removal of the polymer template (e.g., UV ozone-assisted removal, etc.). The resulting porous ZnO coatings can have a thickness in the range between about 140 nm and about 420 nm, which can be obtained using less than 10 (e.g., less than about 8, less than about 6, or about 5, etc.) cycles of SIS. The pores in the resulting inorganic film such as a ZnO film fabricated via swelling-assisted SIS are highly accessible and up to about 98% of pores are available for solvents penetration. As described herein, the preparation process can result in a surface of nanoporous ZnO films being terminated with —OH groups.

The porous inorganic films can be used for various sensor applications. For example, DFT calculations show lower energy barrier for ethanol-induced release of oxygen restricted depletion layer in case of the presence of —OH groups at the ZnO surface and hence can lead to higher sensitivity in sensing of ethanol. This allows sensors using a porous inorganic film to be used in sensing applications for compounds such as ethanol. As an example, the response of ZnO porous coatings with different thicknesses and porosities to ethanol vapors can be measured using combined mass-based and chemiresistive approaches at room temperature and 90° C. The porous ZnO conformal coatings reveal a promising sensitivity toward detection of ethanol at low temperature sensitivity. The results demonstrate the potential of the SIS approach for the design of conformal ZnO coatings with controlled porosity, thickness, and composition that can be adapted for sensing applications. The films can also be used to sense other compounds such as water, hydrogen, oxygen, hydrocarbons (e.g., methane, etc.), carbon monoxide, carbon dioxide, polar organic compounds, or any combination thereof.

The films described herein can be produced using a number of techniques. In some aspects, films with different porosity and thickness can be synthesized using a swelling-assisted sequential infiltration synthesis approach. In this process, various polymers can be used to form a template. Polymers such as block copolymers can be used to form a template having both hydrophilic and hydrophobic regions. For example, polymers such as a polystyrene-block-polyvinyl pyridine, a polystyrene-block-polymethylmethacrylate, a UV-curable photoresist, a polymethylmethacrylate, a polymer of intrinsic microporosity, or any combination thereof can be used. In some aspects, the polymer can be a polystyrene-block-polyvinyl pyridine (PS-b-P4VP) polymer. The polymers can start as powders with molar weights between about 75k-b-25k and 25k-b-25k. The powders can be dissolved in an organic solvent such as toluene at a suitable concentration (e.g., 1-5 wt. % or about 3 wt. %) based on the total weight of the solution. The resulting polymer solutions can be filtered to remove any agglomerates. For example, the polymer solutions can be filtered through 0.4 µm and 0.2 µm sized filters to remove residual large agglomerates.

The polymer solutions can then be disposed on a substrate or surface to form the template for the metal containing precursors. In some aspects, the polymer solutions can be spin-coated on a substrate. The resulting layer can have a thickness between about 140 nm and about 420 nm, which can depend on the spinning rate and/or the composition of the polymer solution. For example, spin-coating of the polymers can be performed at 2,000, 3,000, and 4,000 rpm that resulted in coating thickness of 330, 260, and 150 nm for 25-25 and 420, 280, and 140 nm for 75-25 BCPs correspondingly.

In some aspects, the polymer and/or polymer solutions can be disposed on the surface using 3-D printing techniques. In this aspect, the polymer and/or polymer solution can be printed directly onto the surface of a material to form the polymer template. Printing the polymer may allow for control of the size, shape, and morphology of the polymer on the surface.

The substrate can include any suitable surface, and in some aspects can comprise a material suitable for use in forming a sensor. For example, any suitable semiconductors, electric connections and the like can be used as the surface upon which the film is formed. In some aspects, the film can be formed on silicon dioxide that can be in the form of wafers or AT-cut QCM crystals with $SiO_2$-coated electrodes. In some aspects, the film can be formed on a polymer such as polydimethylsiloxane (PDMS), nylon, a polyimide such as kapton, or other suitable substrates.

In some aspects, a coating of a corresponding inorganic material can be placed on the surface between the surface material and the film. The inorganic material may be formed as a non-porous layer to promote adhesion between the film and the surface. As an example, a zinc oxide film can be formed on a surface such as silicon dioxide, and the film of zinc oxide can be formed on the zinc oxide layer. The use of a plain surface such as a silicon dioxide substrate can be used to eliminate surface contribution to conductivity while ZnO better enabled adhesion of the coatings.

Swelling of the polymers before the SIS process can be performed to enable better full-thickness diffusion of the inorganic vapors and to introduce additional functional groups for the infiltration. The swelling can be performed in an organic solvent, including a polar organic solvent. For example, ethanol, being selective to polar vinyl pyridine domains of the BCP, can be used to selectively swell the polar domains in the block copolymer. After soaking in the swelling solvent, the samples can be removed from contact with the solvent and dried. The drying step can be performed at room temperature to prevent the collapse of the swelling-introduced porosity in the polymers.

Infiltration of precursors in the swollen polymer can be performed using gas phase or liquid phase infiltration. The infiltration process can use SIS in an atomic layer deposition system (e.g., Cambridge ALD system). Various precursor solutions containing the inorganic precursors can be used. For example, a zinc precursor such as diethyl zinc (DEZ) can be used to infiltrate zinc into the swollen polymer template. Other precursors can include elements such as aluminum, or any other suitable metal. Alternatively, liquid phase infiltrants of the precursors can be used to sequentially contact the polymer matrix. The infiltration process can be carried out at a temperature below a melting temperature or degradation temperature of the polymer to avoid degrading the structure of the pores formed by the swollen polymer. For example, the process can be carried out at less than about 100° C. or less than about 90° C. to avoid melting of swelling-formed predefined polymer structures. The infiltration process can use between about 2 and about 20, or between about 3 and about 10, or between about 4 and about 8 infiltration cycles to infiltrate the precursor into the swollen polymer.

After the infiltration, the polymer templates can be removed using any suitable methods such as thermal removal, radiative removal, and the like. In some aspects, the polymer template can be removed by exposing the infiltrated samples to ultraviolet (UV) ozone for a suitable time period between about 1 and about 24 hours. This process can allow for the removal of the polymer without the use of high temperatures that can damage or degrade the substrates and surfaces upon which the film is formed. The porosity of the resulting samples can be between about 50% and about 70% as measured with spectroscopic ellipsometry.

In some aspects, the inorganic film can be doped with one or more elements or compounds to alter the performance of the material. The doping can be carried out using a gas or liquid phase dopant in contact with the film. In some aspects, the film can be doped by including the dopant in the precursor solution at the time of infiltrating the precursor into the swollen polymer. Any suitable dopant can be used based on the composition of the film. Suitable dopants can include, but are not limited to, Al, Co, Cu, Fe, Mg, Mn, Pt, Pd, Ag, Au, or any combination thereof. The dopants may be used to improve the sensitivity of the resulting film to one or more compounds when the films are used as sensors.

As formed, the films on the surfaces can be used to form various sensors using changes in resistivity, capacitance, or weight. The sensors can be used to detect various compounds that interact with the films such as alcohols (e.g., ethanol, etc.).

EXAMPLES

The disclosure having been generally described, the following examples are given as particular embodiments of the disclosure and to demonstrate the practice and advantages thereof. It is understood that the examples are given by way of illustration and are not intended to limit the specification or the claims in any manner.

Polymer template preparation: The samples of nanoporous zinc oxide films with different porosity and thickness were synthesized using a swelling-assisted sequential infiltration synthesis approach. Polystyrene-block-polyvinyl pyridine (PS-b-P4VP) polymer powders with molar weight 75k-b-25k and 25k-b-25k were purchased from the Polymer Source Inc. The powders were dissolved in toluene at a concentration of 3 wt. %. The resulting polymer solutions were filtered through 0.4 μm and 0.2 μm sized filters to remove residual large agglomerates. Polymer solutions were spin-coated on silicon dioxide wafers (300 nm thick $SiO_2$ on Si, 10 mm square samples) or AT-cut QCM crystals (1 inch in diameter with resonant frequency about 5 MHz, purchased from Fil-Tech) with $SiO_2$-coated electrodes. Silicon dioxide substrate was used to eliminate surface contribution to conductivity while ZnO enabled better adhesion of the coatings. Spin-coating of the polymers was performed at 2,000, 3,000, and 4,000 revolutions per minute (rpm) that resulted in coating thickness of 330, 260, and 150 nm for 25-25 and 420, 280, and 140 nm for 75-25 BCPs correspondingly.

Swelling assisted SIS: Swelling of the polymers before the SIS process was performed to enable better full-thickness diffusion of the inorganic vapors and to introduce additional functional groups for the infiltration. The swelling was performed in ethanol, being selective to polar vinyl pyridine domains of the BCP, at 75° C. for 1 hour. After 1 hour, the samples were carefully removed from ethanol and dried at room temperature in the fume hood for at least 2-3 hours. The drying step was performed at room temperature to prevent the collapse of the swelling-introduced porosity in the polymers.

Vapor-phase infiltration: Infiltration of zinc oxide in the polymer was performed using sequential infiltration synthesis in an atomic layer deposition system (Cambridge ALD system). The recipe for the infiltration was adapted from the previously reported aluminum oxide infiltration with the trimethylaluminum (TMA) precursor being replaced by diethyl zinc (DEZ). The samples were placed on a stainless-steel tray inside the ALD chamber at 90° C. to avoid melting of swelling-formed predefined polymer structures. A 100 standard cubic centimeters per minute (sccm) nitrogen flow was introduced to the chamber for 30 minutes prior to the infiltration. Five cycles of the ZnO infiltration were performed as: 10 milliTorr (mTorr) of the DEZ precursor was introduced with 20 sccm nitrogen flow into the reactor for 400 seconds (s); after the predetermined time, when the infiltration of the polymer occurs, the excess of the reactant was evacuated and followed by introducing of 10 mTorr of $H_2O$ for 120 s; the chamber was then purged with 100 sccm of nitrogen to remove not-infiltrated byproducts. The bulk ZnO coating has been deposited directly on the silicon dioxide substrate without the polymer template and using 500 cycles of the regular ALD process.

Polymer removal: After the infiltration, the polymer templates were removed by exposing the infiltrated samples to ultraviolet (UV) ozone (UVOCST16x16 OES, 254 nm UV wavelength) for 10 hours. Previously, this procedure was shown to be effective for polymer removal without the need to overheat the QCM substrates and thus to prevent their loss of sensitivity. The porosity of the resulting samples has been measured with spectroscopic ellipsometry to be 50% and 70% for PS25-b-P4VP25 and PS75-b-P4VP25 correspondingly similarly as in previous studies with SIS-synthesized nanoporous alumina.

QCM analysis: QCM technique was used for the quantitative analysis of the materials infiltration process as well as for sensing characterization. The changes in the resonant frequency and mechanical resistance of the QCM oscillations were monitored using the SRS QCM200 controller. For the infiltration steps analysis, the readings of the QCM resonant frequency were stabilized for at least 1 hour at room temperature (22° C.) in the ambient environment before recording the measurements. In sensing tests, the QCM setup was placed in a custom-built vacuum chamber connected to nitrogen gas and ethanol. The chamber also allows heating from the room temperature up to 90° C. In the chamber, two samples, one deposited on the QCM and one deposited on the silicon dioxide substrate prepared using exactly the same sample preparation procedure, were connected next to each other for simultaneous absorption and electrical conductivity measurements. Electrical conductivity measurements were performed using the van der Pauw method with four probes connected to the corners of the sample and resistance measured using 2401 Keithley Source Meter. The QCM sample has been fixed in a custom-designed stainless-steel holder connected to heating elements and a thermocouple for the controlled temperature tests. To remove the effect of air and disruptive moisture on the zinc oxide samples, after inserting QCM and wafer sample in the vacuum chamber, the chamber was pumped down about $10^{-3}$ Torr. Next, the samples were exposed to the ethanol vapors introduced to the chamber at a rate of about 3 Torr/minute until the pressure in the chamber reaches 4 Torr (monitored using 275 Granville-Phillips Vacuum Gauge). The absorption capacity of the QCM samples was calculated based on the change in the QCM resonant frequency that is directly proportional to the added mass:

$$\Delta f = -\frac{2f^2}{A\sqrt{\rho_q \mu_q}}\Delta m \qquad (Eq.\ 1)$$

where f is the frequency of oscillation of unloaded crystal, $\rho_q$ is the density of quarts (2.648 (gram per centimeter cubed) g $cm^{-3}$), $\mu_q$ is the shear modulus of quartz (2.947× $10^{11}$ gram per centimeter second squared) g $cm^{-1}$ $S^{-2}$), A is the QCM surface area, and $\Delta m$ is the mass change.

Changes in the electrical conductivity of the sample deposited on the silicon dioxide wafer and in the QCM resonance frequency of the sample deposited on the QCM substrate were performed simultaneously for direct correlation. All the measurements were repeated at least three times upon introducing the ethanol vapors and evacuating the chamber. Similar analysis has been performed using water, acetone, and toluene vapors.

Characterization: Scanning electron microscopy (SEM) analysis was performed using Field Electron and Ion Company Nova Scanning Electron Microscope (SEM). Transmission electron microscopy (TEM) analysis on the samples crushed and deposited on the carbon mesh TEM grid was performed using a JEOL 2100F TEM microscope. Chemical modifications of the polymer templates during swelling and infiltration were evaluated using a Nicolet 6700 Fourier Transformation Infrared (FTIR) spectrometer with a 700-4, 000 per centimeter ($cm^{-1}$) spectral range. X-ray diffraction (XRD) analysis has been performed using the Bruker D2 X-ray diffractometer with Cu Kα source of irradiation.

Density Functional Theory (DFT) Calculations: The DFT calculations were performed using the framework of DFT in Vienna Ab initio Software Package (VASP 5.4.1). The simulation models of ZnO surfaces, with and without hydroxide groups, and ethanol molecules were built using the software for simulating and modeling materials, such as Material Studio. For this, a 2×2 ZnO supercell included 5 layers in the (111) plane and one layer of O—H group or O atoms was added on the surface. A vacuum layer of 20 angstroms was built to avoid interactions between periodic ZnO groups. Set of points in the Brillouin zone used to sample the reciprocal space, such as K points meshes, were set up as 3×3×1 grids.

The potential for the ZnO affinity to ethanol was evaluated by calculating the adsorption energy of surface species during the different steps of the chemical reactions. The adsorption energy is defined as:

$$E_{ads} = E_{total} - E_{surface} - E_{species} \quad (Eq. 2)$$

where $E_{total}$ represents the total energy of adsorbed species on the ZnO surface, $E_{surface}$ is the energy of the ZnO surface before the reaction step, and $E_{species}$ is the energy of species in the gas phase. The resulting from the VASP calculations changes in the structure of the ethanol molecules adsorbed on the ZnO surface were visualized using the VESTA software.

The synthesis of ZnO using infiltration of polymers via the SIS approach is possible with the priming of the polymer template with the alumina layer. The major reasoning for this is the limited number of reactive sites in the BCP for the attachment of the DEZ molecules even if they diffuse through the nanodomains of the BCP film. However, residual processing solvent can mediate the infiltration of even non-reactive polymers with ZnO precursors. Improved infiltration of the BCP after the selective swelling in ethanol as a result of the increased number of reactive infiltration sites suggests the swelling step prior to the SIS. In addition, the swelling increases the porosity enabling the synthesis of high surface area films. As in the case of alumina, swelling of the BCP template allows significant increase in the infiltration efficiency of the BCP with ZnO precursors. The swelling of the BCPs can occur with a different contribution of polar domains such as PS25-b-P4VP25 and PS75-b-P4VP25.

Figure 1B:
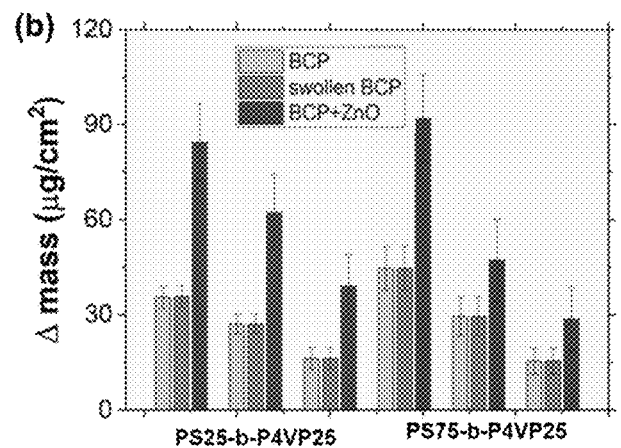
FIG. 1b is a schematic of an embodiment of quartz crystal microbalance (QCM) data demonstrating the degree of the infiltration of the different block copolymer (BCP) templates after the swelling step. The thicknesses of the films are 330, 260, and 150 nm for PS25-b-P4VP25 BCP, and 420, 280, and 140 nm for PS75-b-P4VP25 BCP.

FIG. 1a depicts the major steps involved in porous ZnO coatings via SIS using swollen BCP templates such as (i) deposition of BCP layer via spin-coating, (ii) swelling of the deposited BCP in ethanol for 1 hour (h) at 75° C., (iii) infiltration of swollen BCP with ZnO precursors by cycling the exposure of template to DEZ and $H_2O$, and (iv) formation of all-inorganic porous ZnO by polymer removal. The polymer can be removed by thermal annealing or ozone cleaning. Ozone cleaning because sample preparation of QCM samples cannot be heated up to 450° C. can be required for the complete removal of organics. The QCM analysis (FIG. 1b) of BCPs templates of varied thickness spin-coated on the QCM substrates is used to monitor the mass changes introduced during different steps of the synthesis of porous ZnO conformal coatings. In the case of the alumina, the SIS infiltration mass increase can be directly proportional to the mass of P4VP domains in PS-b-P4VP. However, in the case of the ZnO, the QCM data suggests that the swelling-induced reactive sites are present not through the entire volume of the polar domains as a direct correlation is not observed between the content of polar domains and mass change in PS-b-P4VP BCP templates (FIG. 1b). The swelling step can improve the efficiency of the ZnO infiltration.

Figure 2A:
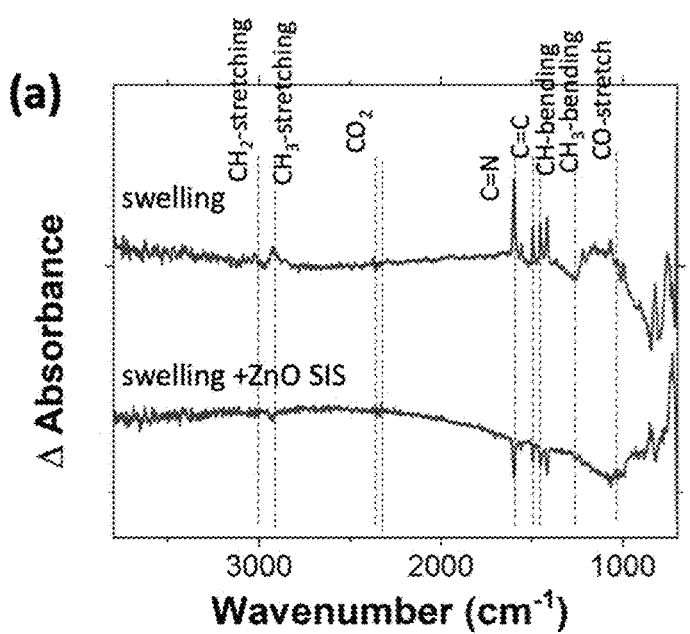
FIG. 2a is a schematic of an embodiment of fourier transformation infrared (FTIR) spectrometer analysis of the 150 nm thick PS25-b-P4VP25 BCP during swelling and infiltration with zinc oxide processes. The FTIR spectra are normalized to the FTIR spectrum of as-deposited BCP to highlight the changes of the functional groups initiated by swelling and infiltration processes.
Figure 2B:
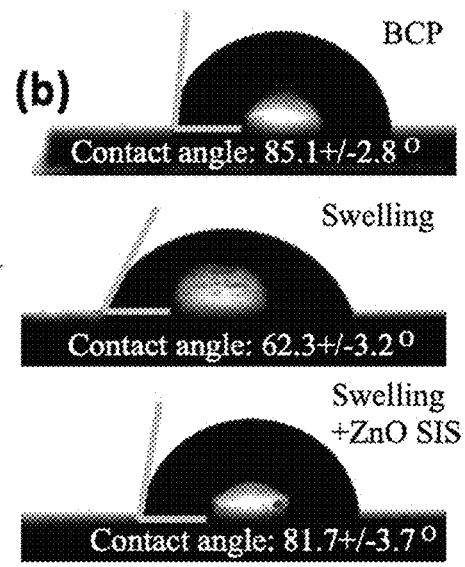
FIG. 2b is a schematic of embodiments of contact angle data demonstrating the wettability of the as-deposited PS25-b-P4VP25 BCP, BCP swollen in ethanol for 1 hour at 75 degrees Celsius (° C.), and BCP swollen and infiltrated with zinc oxide precursors (diethylzinc (DEZ) and $H_2O$) for 5 cycles.

To unravel the binding events in the infiltration of the BCPs with ZnO precursors, FTIR analysis of the PS25-b-P4VP25 BCP template can be used after swelling and after infiltration relative to the initial BCP film spectrum (FIG. 2a). The swelling in pure ethanol increases absorption for CH bending of $CH_3$ and $CH_2$ groups at 1580, 1500, 1450, and 1410 per centimeter ($cm^{-1}$). Analysis of the swollen BCP after the SIS step indicates that swelling creates major sites for infiltration with zinc oxide precursors. The contact angle measurements FIG. 2b) demonstrate that swelling makes the polymer surface more hydrophilic as is evidenced from the decrease of the contact angle of water droplets deposited at swollen BCP layers as compared to the initial BCP. In turn, infiltration of swollen BCP with zinc oxide precursors makes the surface more hydrophobic because the contact angle at the interface between the water droplet and infiltrated BCP increases. This observation indirectly confirms that sites capable of binding zinc oxide precursors are generated during swelling. Such modification of BCP enables the deposition of ZnO without the necessity of priming the polymer temperate with alumina.

After the successful ZnO infiltration, to create nanoporous ZnO structures (FIG. 3a-j), the polymer templates are removed by UV ozone cleaning that previously shows effectiveness in polymer removal. The SEM data indicate the overall uniformity of the porous ZnO coatings (FIGS. 3a-b) as a result of efficient nucleation and growth of inorganic clusters within the polymer domains that ensure the formation of continuous ZnO materials similarly to observed previously various SIS-synthesized structures. The electron diffraction analysis points out a good crystallinity of the synthesized ZnO coatings (FIG. 3c) that is further supported by the x-ray diffraction analysis (XRD). The XRD analysis indicates the estimated size of the crystalline domains to be about 2 nanometer (nm).

The accessibility of the pores was analyzed by monitoring the changes in the resonant frequency of the QCM oscillations upon immersing the samples in water (FIG. 3d). The change in the frequency originated both from water trapping in the pores and the effect of the surrounding viscous medium as depicted by Eq. 3:

$$\Delta f = -f^{3/2} \sqrt{\frac{\rho_L \eta_L}{\pi \rho_q \mu_q}} - \frac{2f^2}{A\sqrt{\rho_q \mu_q}} \Delta m \quad (Eq. 3)$$

where $\rho_L$ and $\eta_L$ are the density and viscosity of the liquid, respectively. In the case when QCM is immersed in water, $\rho_L$ is 0.9982 gram per centimeter cubed ($g/cm^3$) and $\eta_L$ is 0.01 gram per centimeter-second ($g/(cm \cdot s)$). Because the infiltration with inorganic precursors takes place only in polar domains and assuming their full infiltration the porosities of final ZnO conformal coatings deposited can roughly be estimated using PS25-b-P4VP25 and PS75-b-P4VP25 templates are 50% and about 70%, respectively. The QCM experiments indicate that about 71% and about 98% of pores are accessible to the solvent. This observation emphasizes the high interconnectivity of the pores in deposited ZnO conformal coatings (FIGS. 3a-j). These data can be in agreement with previous data on porous alumina conformal coatings that have shown up to 98% of the pore volume is available for solvents and vapors.

The XPS data (FIG. 3g) reveal that the "bulk" film is characterized only by one symmetric peak at 1020.8 electron volt (eV) that corresponds to Zn atoms in ZnO lattices of bulk material. Meanwhile, the XPS spectrum of the porous ZnO films has Zn $2p_{3/2}$ peak shifted to the higher energy values with a maximum at 1022.3 eV suggesting $Zn^{2+}$ coordination with OH groups (FIG. 3h). The XPS 0 is spectrum of porous ZnO film exhibits an asymmetric peak that can be fitted by two peaks with maximums at 531.2 eV and about 532 eV that correspond to $O^{2-}$ and $OH^-$ groups while the XPS spectrum of "bulk" ZnO has the peak only at 531.2 eV. Therefore, the XPS analysis of porous ZnO films indicates the presence of a significantly higher concentration of OH groups on the surface of SIS ZnO as compared to ZnO prepared via traditional ALD (FIGS. 3a-j).

To probe the reactivity of ZnO surfaces with ethanol, DFT calculations are performed (FIGS. 4a-c). In the case of the ZnO surface terminated with OH groups, interaction with ethanol involves two OH groups:

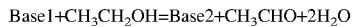

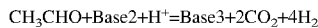

where Base 1 is the initial OH-terminated ZnO structure, Base 2 is the intermediate ZnO structure with ethanol being reduced to ethanol, and Base 3 is the final ZnO structure with surface OH groups being released upon reaction with ethanol.

In contrast, ZnO surface without OH groups where a single O atom connects to two neighboring Zn atoms interacts with ethanol according to a different reaction path, such as:

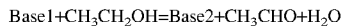

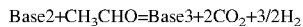

where Base 1 is the initial 0-terminated ZnO structure, Base 2 is the intermediate ZnO structure with ethanol being reduced to ethanol, and Base 3 is the final ZnO structure with surface OH groups being released upon reaction with ethanol.

Indeed, the DFT calculation results for ZnO terminated with —OH groups (FIGS. 4a-c) indicated a lower energy barrier for ethanol-induced release of oxygen restricted depletion layer in case of the presence of OH groups. Inspired by the presence of high concentrations of OH groups and high interconnectivity of the pores in porous ZnO films, porous ZnO coatings can sense ethanol because ZnO has been previously reported to demonstrate promising performance for ethanol sensing.

Ethanol sensing using nanoporous ZnO films. The n-type semiconductor, ZnO, is one of the traditional choices of material demonstrating changes in electrical properties as a result of interfacial redox processes. The initial resistance of the ZnO, which is an n-type semiconductor, is affected by the adsorption of oxygen from the air that leads to the formation of an electron depletion layer increasing the surface resistance of ZnO. Upon introducing ethanol, acting as a reducing gas, removal of chemisorbed oxygen leads to the release of conduction band electrons and thus results in resistance decrease. It has been suggested that in the presence of metal oxide, ethanol undergoes catalytically-driven dehydration and dehydrogenation reactions leading to the formation of gaseous $CO_2$ and $H_2O$ as the end products that are later detected by carbon dioxide detector tube installed in the testing chamber. The presence of the hydroxyl groups, chemisorbed as a result of exposing the ZnO material to the humid environment, further promotes the surface reactivity with the ethanol vapor. As the SIS process leads to a higher surface concentration of OH groups, this can further enhance the sensitivity of the SIS-designed ZnO films to the ethanol vapors.

The QCM analysis is combined with the 4-probe electrical conductivity monitoring upon exposure of the porous ZnO to ethanol vapors to get insights into structure-property correlations. For this, a vacuum chamber that allows measurement of the materials' adsorption simultaneously with the changes in the electrical conductivity of the films (FIG. 5a). To obtain quantitative estimations of the ethanol-caused changes in the material's properties, two identical samples, one on the QCM and one on the wafer, next to each other enables the same exposure of both samples. After pumping down the chamber, the samples are exposed to ethanol introduced at a rate of about 3 Torr per minute. The pressure 1 Torr corresponds to about $1.3 \cdot 10^3$ ppm.

To probe the sensitivity of the samples to the ethanol exposure, the changes in the QCM frequency and electrical conductivity of the square samples at room temperature and 90° C. FIGS. 5c-d summarize the results from the tests for porous ZnO films synthesized using PS25-b-P4VP25 and PS75-b-P4VP25 templates performed at room and at 90° C. that is substantially lower than temperatures previously reported in other studies that are typically in the 200-400° C. temperature range.

The measured changes in the QCM resonant frequency to characterize the ethanol absorption efficiency of the nanoporous zinc oxide films. In a simple model, the ethanol molecules attach to the ZnO surface vertically. Ethanol coverage $A_E$ can be presented as:

$$A_E = N \times \pi r^2 \qquad (Eq. 4)$$

where N defines the number of the adsorbed on the ZnO ethanol molecules that can be determined from the mass changes:

$$N = \frac{\Delta m \times N_A}{M_{ethanol}} \qquad (Eq. 5)$$

By combining Eq. 4 and Eq. 5 the surface coverage of the films can be roughly estimated as:

$$A_E = \frac{\Delta m N_A \pi r^2}{M_{ethanol}} \qquad (Eq. 6)$$

Table 1 summarizes the resulting ethanol surface area coverage of the films on the QCMs at 25° C. and 90° C.:

TABLE 1

| | PS25-b-P4VP25 | | | PS75-b-P4VP25 | | |
|---|---|---|---|---|---|---|
| | 330 nm | 260 nm | 150 nm | 420 nm | 280 nm | 140 nm |
| 25° C. | 183 cm² | 230 cm² | 151 cm² | 381 cm² | 167 cm² | 143 cm² |
| 90° C. | 358 cm² | 238 cm² | 230 cm² | 620 cm² | 350 cm² | 207 cm² |

FIG. 5e summarizes the changes in the mass and resistance as a function of the introduced ethanol pressure at room temperature and 90° C. The results suggest that at room temperature QCM immediately responds to the introduced ethanol vapors while there is a slight delay (about 6 s corresponding to about 0.3 Torr) in the electrical changes of the porous ZnO sample. While QCM enables the detection of ethanol even at room temperature, the change in the resistivity of ZnO is rather noisy at room temperature (FIG. 5b). However, heating the sample only up to 90° C. significantly stabilizes and increases the chemiresistive response. Interestingly, though QCM demonstrates sensitivity not only to ethanol but also to adsorption of the water vapors, there are no indicative changes in the resistance response of the films exposed to low pressures of water and other gasses including acetone and toluene.

The results suggest sensitivity of the SIS-deposited nanoporous ZnO even at low temperatures, while traditional ZnO films are prepared via ALD, sol-gel processing, hydrothermal synthesis, or molecular beam epitaxy usually require elevated temperatures to demonstrate a reduction in resistance. For instance, the change in sheet resistance up to 1,000 ohms per square (Q/D) at 90° C. is observed that is comparable with changes in resistivity previously measured at significantly higher temperatures of 350° C. While porous ZnO films work well when both detection of mass and resistivity changes are used to quantify the surface interactions with the reactive medium (ethanol), the different strategies for the optimization of the sensing layer are likely required for QCM and chemiresistive detection. Thus, QCM seems to benefit from more porous structures while the most porous ZnO films used do not demonstrate the most pronounced drop in resistivity. In fact, the chemiresistive response is more pronounced in the case of ZnO films with 50% porosity. The higher temperature (90° C.) increases the response of the porous ZnO coatings to their exposure to ethanol by, respectively, 37% and 122% when QCM and resistivity measurements are conducted. Therefore, an increase in the temperature promotes the interactions of the ZnO surface with ethanol molecules. Thus, the temperature does not only help to overcome the activation barrier for ethanol conversion, but also improves both chemiresistive and adsorption characteristics of the ZnO surface upon exposure to ethanol.

A new synthetic approach for the design of conformal nanoporous ZnO coatings with high control over porosity, thickness, and composition. In some embodiments, 140-420 nm thick ZnO conformal coatings are synthesized using only 5 SIS cycles while the traditional ALD process would typically require about 1,000-4,000 cycles for the films with such thicknesses. Although the QCM results indicate low selectivity of the ZnO to different vapors, the coatings demonstrated a promising chemiresistive sensitivity to ethanol vapors even at room temperature that is attributed to the high hydrophilicity of the coatings when OH groups present on the material surface. DFT calculations further confirm the lowering of the energy barrier for ZnO depletion layer removal in ethanol reducing atmosphere when the surface of the zinc oxide is rich in OH groups. Moreover, the termination of porous ZnO layers with —OH groups easily functionalizes with different functional molecules makes them suitable for biomedical applications.

Sample Preparation. The ZnO samples are prepared by adopting two infiltration techniques: solution-based infiltration (SBI) and swelling-assisted SIS. The polymer of intrinsic microporosity (PIM-1) is synthesized using known procedures. The block copolymer poly(styrene-block-4-vinylpyridine) (PS-P4VP) (specifically in this study (PS (25)-PVP(25)) is purchased from Polymer Source, Inc.

The PIM-1 is dissolved in chloroform to prepare a solution of 0.03 gram per milliliter (g/mL) concentration. PIM-1 templates on QCM substrates with titanium-coated electrodes and $SiO_2$/Si substrates are prepared by spin coating the polymers at 800 rpm for 40 s. After spin coating, the samples are baked at 70° C. for 1 hour (h) for full evaporation of the chloroform and improved adhesion of the film to the substrates. The PS-P4VP BCP is dissolved in chloroform to prepare a solution of 2 wt. %. The BCP samples are spin-coated on the silicon wafer and QCMs at 2,000 rpm for 40 s.

The samples for the X-ray diffraction (XRD) study are prepared using a paper filter (Whatman, Grade I) as a substrate for the polymer template during the swelling and infiltration steps. Paper filters are immersed in the polymer solution and sonicated for 30 minutes (mins) for absorption of the polymers inside the cellulose matrix.

Infiltration of the polymer templates with solution-phase precursors: ZnO samples are synthesized by the immersion of the PIM-1 and PS-P4VP(25-25) templates in a solution of zinc acetylacetonate, $Zn(acac)_2$ in ethanol at different concentrations (from 0.05 wt. % up to 1 wt. % concentration) at 75° C. for 1 h. The ethanol solution of $Zn(acac)_2$ is stirred for 1 hour for complete solubility of the $Zn(acac)_2$ powder in ethanol and left for a few hours before immersion of the polymer. The temperature of this procedure is selected based on the earlier results indicating the higher swelling rates of the polymer at an elevated temperature.

Infiltration of the polymer templates with gas-phase precursors: Infiltration of the polymer templates with gas-phase precursors (diethyl zinc (DEZ) and water vapors) is conducted using the SIS technique which is a variant of the ALD process for vapor phase infiltration of ZnO in the polymer template. Before the infiltration, the PS-P4VP films are swollen to increase the efficiency of the infiltration of the PS-P4VP template with zinc oxide precursors. The swelling is performed in ethanol at 75° C. for 1 h, followed by drying under the fume hood for 2-3 h to prevent collapsing of the swelling-induced free volume in the polymers. PIM films deposited on the substrates are immersed in ethanol heated to 75° C. for about 1 hour and then dried out at nitrogen flow to remove the residue of the solvent. Such treatment is reported to increase the free volume in the polymer template and increase gas permeability that is attributed to improved efficiency of the PIM-1 infiltration with the gas phase precursors.

The SIS is done using Veeco Savannah S100 ALD System. Several deposition runs are made to optimize the recipe for infiltration of ZnO by using diethyl zinc precursor (DEZ). The samples are placed in the reactor chamber at 90° C., below the glass transition temperature of the PS-P4VP to avoid compromising the integrity of the polymer structure. Nitrogen (20 sccm) is introduced into the reactor chamber prior to the infiltration. The polymer templates are exposed to 5 cycles of DEZ precursor for 400 s, when the infiltration of the polymer is completed, the excess of the reactant is evacuated and followed by exposure to 5 cycles of $H_2O$ for 200 s, the chamber is then purged with 100 sccm of nitrogen to remove excess byproducts.

Polymer Removal. UV ozone cleaner (UVOCSR16x16 OES, 254 nm UV wavelength) is used for the removal of polymer templates on the QCM crystal after the infiltration. The samples are exposed to UV ozone treatment for 10 h at room temperature. For the $Si/SiO_2$ samples, the polymer templates are removed in a Thermo Scientific Lindberg Blue M Furnace for 4 h at 450° C. with oxygen flowing through the furnace tube, to transport polymer particles removed away from the surface of the sample.

QCM Analysis and Gas Sensing Measurement. The QCM analysis is used for the in situ quantitative analysis of the swelling events, infiltration process after the SBI and SIS, and in situ analysis of infiltration during the sensing measurements. The QCM is made of an AT-cut piezoelectric quartz crystal (1 inch (in.) in diameter) which oscillates in a shear mode with a resonant frequency of 5 megahertz (MHz). The titanium and gold-coated QCMs are purchased from Fil-Tech. The changes in the resonant frequency of the QCM oscillations when in contact with a liquid media and mass are observed with the SRS QCM200 controller.

Gas sensing test is performed in a custom-built vacuum chamber connected to a nitrogen gas, and ethanol supply. In the chamber, two samples, one deposited on the QCM and one deposited on the Si/SiO$_2$ substrate are prepared with the SIS and SBI preparation procedure, are placed next to each other to simultaneously measure ethanol adsorption efficiency and the induced changes in electrical conductivity. A custom-designed stainless-steel holder is used to hold the QCM sample in place for the controlled temperature tests. Electrical measurements are conducted using the van der Pauw method with four probes connected to the corners of the sample and the resistance is measured with a 2401 Keithley Source Meter. To eliminate the effect of air and disruptive moisture on the ZnO samples, the chamber is pumped down to about $10^{-3}$ Torr after placing the QCM and silicon dioxide samples in the vacuum chamber. The samples are then exposed to the ethanol vapors introduced to the chamber, and the pressure is monitored using a 275 Granville-Phillips Vacuum Gauge. The resonant frequency of the QCM and the resistance readings on the source meter are allowed to stabilize at room temperature before readings are recorded.

The adsorption capacity of the QCM samples is estimated from the change in the QCM resonant frequency that is directly proportional to the added mass:

$$\Delta f = -\frac{2f^2}{A\sqrt{\rho_q \mu_q}} \Delta m \quad \text{(Eq. 1)}$$

where f is the frequency of oscillation of the unloaded crystal, $\rho_q$ is the density of quartz (2.648 gram per centimeter cubed (g cm$^{-3}$)), $\mu_q$ is the shear modulus of quartz (2.947×10$^{11}$ gram per centimeter second squared (g cm$^{-1}$ S2)), A is the QCM surface area, and $\Delta m$ is the mass change. Five different tests are carried out on each sample upon exposure to ethanol vapor and venting of the chamber.

Characterization. Scanning Electron Microscopy (SEM) analysis of the samples is performed using an FEI Nova SEM. The analysis of the surface topography and roughness profile of the samples is performed with a Bruker Multimode Atomic Force Microscopy (AFM). The images are acquired in tapping mode in the air with a scan rate of 0.5 hertz (Hz) using antimony doped silicon tips with a spring constant of 42 newton per meter (N/m). X-ray diffraction (XRD) analysis is done with Bruker D2 Phaser and Bruker D8 Discover. Contact angle measurements are conducted by the Sessile water drop (10 μL) method using a Ramé-Hart 250 contact angle goniometer. X-ray photoelectron spectroscopy (XPS) measurements are done with a PHI 5000 Versaprobe spectrometer with monochromatic 1486.6 electron volt (eV) Al Kα radiation. All binding energies are corrected for the charge shift using the C is peak at 284.5 eV, and the energy resolution is 0.1 eV. Porous ZnO conformal coatings can be synthesized using BCPs by SIS using a gas-phase precursor. A polymer template such as the PIM-1 template can be used for the fabrication of porous coatings. The polymer templates can be infiltrated with metal oxide precursors from the solution phase to simplify the synthesis of porous metal oxide coatings. FIG. 7 summarizes the templates and infiltration techniques that can be used to synthesize porous ZnO. The scoring of the properties is done using the performance of ZnO porous structures for ethanol sensing.

While methanol can be used as a solvent to treat PIM-1 to improve its gas permeability, other solvents can effect solvent treatment on the subsequent infiltration of PIM-1 with gas phase precursors. The QCM technique can monitor the in-situ change in resonant frequency between bare QCM crystals and the polymer-coated QCM crystals before and after their exposure to different media. While PIM-1 is soluble only in tetrahydrofuran (THF) and chloroform, the data indicates a very small decrease in polymer mass after treatment with other solvents such as methanol, ethanol, acetone, and toluene. Although not wanting to be bound theory, it can be attributed to the removal of the chloroform trapped during spin-PIM-1 coating and/or removal of oligomers possibly present in the initial PIM-1. The QCM results suggest that there is no significant change in the mass of the polymer after swelling in ethanol and methanol, which indicates that no molecular degradation of the polymer occurred during swelling and all changes shown in the QCM experiment can be attributed to its volumetric expansion. Ethanol is used for all experiments with PIM-1 because ethanol is used to swell BCPs and the use of the same solvent enables minimizing of the synthesis parameters. Therefore, ethanol is used as a treatment solvent to prepare both PS-P4VP and PIM-1 templates for gas-phase infiltration and as a solvent of zinc acetylacetonate (Zn(acac)$_2$) that serves as a solution-phase precursor. Similar to methanol, exposure of PIM-1 to ethanol is found to be very effective in preserving the porosities created in the polymer due to the high vapor pressure of ethanol, thereby preventing the mobility of the polymer chains toward equilibrium packing.

After ethanol treatment, PS-P4VP and PIM-1 templates are exposed to gas or solution phase precursors. QCM technique is used to analyze the efficiency of the infiltration by monitoring the mass change of the samples (as depicted in FIGS. 8a-f). In the case of gas-phase precursors (as depicted in FIG. 8c), a significant mass gain is observed when 3 ALD cycles are performed. After 3 cycles, the mass gain significantly slows down indicating that PIM-1 is approaching full infiltration. Therefore, the number of ALD cycles in SIS is limited to 5.

Different concentrations of Zn(acac)$_2$ in ethanol are tested to infiltrate PIM-1 with zinc precursors from the solution phase. An increase in the samples' mass upon their exposure to a more concentrated Zn(acac)$_2$ ethanol solution indicates that PIM-1 efficiently adsorbs the zinc precursor dissolved in ethanol (as depicted in FIG. 8a). The substantial rise in the mass of the PIM-1 immersed into Zn(acac)$_2$ ethanol solutions with concentrations above 0.1 wt. % can be attributed to the possible crystallization of zinc precursors from the solution.

QCM study indicates that Zn(acac)$_2$ adsorbed by polymer does not desorb back into ethanol as evidenced by no mass change upon immersion of the infiltrated polymer templates into ethanol. However, exposure of infiltrated polymers with Zn(acac)$_2$ to water is associated with a loss of about half mass gained during the infiltration step (as depicted in FIG. 8b and FIG. 8e). The desorption of Zn(acac)$_2$ can indicate; however, it has a lower solubility in water as compared to ethanol. Therefore, no change in mass upon immersion of infiltrated polymer in ethanol and mass decrease are observed in water point out to a reaction between the infiltrated Zn(acac)$_2$ and water (e.g., exchange of acetylacetonate ligand with OH group). FIG. 9 shows that almost no changes are observed in the surface topography of the swelled PIM, in comparison to the initial PIM (as depicted in FIG. 9). This further confirms the stability of the polymer after swelling in ethanol. However, the swelled polymer exhibits an increase in roughness height, indicating the presence of swelling-induced porosities. Surface topography for the PS-P4VP(25-25) and PIM infiltrated with zinc oxide precursors from solution and gas phases, and all-inorganic ZnO films formed after polymer removal are shown in FIG. 9 and FIG. 10a-d.

After infiltration of the polymer templates with zinc oxide precursors from solution and gas-phase precursors, the polymer templates are removed via UV ozone cleaning that results in the formation of porous ZnO films. The SEM images (FIG. 11a-e) indicate similar morphologies of the porous ZnO films obtained with the same type of polymer template regardless of the type of the zinc oxide precursor. The SEM analysis shows that the surface of ZnO films obtained with PIM-1 templates is characterized by the presence of some circular features. Their formation can be attributed to the capture of the gas or solvent molecules by PIM-1 during its spin-coating that are released during polymer removal causing the appearance of circular dimples.

FIG. 11e demonstrates the X-ray diffraction (XRD) patterns of the porous ZnO samples prepared using two types of polymer templates with both solution and gas-phase precursors. The diffraction peaks of the synthesized ZnO films are indexed to the hexagonal wurtzite crystal structure of ZnO. As it is evidenced by rather narrow XRD peaks, ZnO samples are prepared using highly crystalline solution-phase precursors. However, the XRD spectra of ZnO samples are prepared using gas-phase precursors characterized by broader peaks indicating the nanocrystalline nature of the synthesized material. A comparison of their XRD spectra indicates that the PIM-1 template enables the synthesis of ZnO with a smaller crystalline size. These results are in agreement with the highly nanocrystalline structure of ZnO nanowires synthesized via the infiltration of lithographically patterned SU-8 polymer template using gas-phase precursors.

XRD data reveal a substantial shift of peaks corresponding to the (002) plane of wurtzite ZnO to high 2θ as well as peaks corresponding to the (102) plane for all samples (as depicted in FIG. 11e). The lattice plane (002) is polar and consists of Zn atoms only. The shift of (002) peaks indicates that Zn atoms are arranged significantly closer than the interplanar spacing of 2.59 Å characteristic of typical ZnO wurtzite. In turn, peaks corresponding to non-polar (100) planes consisting of both Zn and O atoms are in agreement with peak positions of (100) planes with an interplanar spacing of 2.8 Å of ZnO with wurtzite structure. These data point out the distorted structure of ZnO samples.

XPS studies analyze the surface composition of synthesized porous ZnO films. High-resolution XPS spectra of the Zn $2p_{3/2}$ and O 1s regions are shown in FIGS. 12a-h. For all samples, the Zn $2p_{3/2}$ peak is fitted to only one Gaussian. The XPS spectra of all porous ZnO films have Zn $2p_{3/2}$ peaks at ~1021.2 eV, suggesting a +2 oxidation state of surface zinc and that the surface of samples is Zn dominated since the stoichiometric ZnO reveals a corresponding peak at 1022 eV. The most intense peaks of the XPS spectra in O 1s regions of ZnO samples are obtained with gas-phase precursors are at about 529.8 eV that correspond to the Zn—O bond in ZnO lattice; however, these peaks are shifted to slightly lower values of binding energies when gas-phase precursors are used to infiltrate both PIM-1 and PS-P4VP templates. Because all binding energies are corrected for the charge shift using the C 1s peak, the charging effect can be excluded and attribute such shifts to the subtle difference in atomic arrangement around oxygen atoms in ZnO samples prepared with gas-phase precursors. The XPS spectra of ZnO are synthesized with PS-P4VP (25-25) can be deconvoluted into two Gaussian sub-peaks, at about 530 eV and 531.5 eV, that is characteristic of oxygen vacancies. The broader and more asymmetric peaks of the O 1s peaks indicate that ZnO obtained using PIM-1 templates has more species at the surface. The corresponding spectra can be deconvoluted into three different Gaussian peaks. The ZnO obtained using PIM-1 and gas-phase precursors also reveal a peak at 531.5 eV indicative of oxygen vacancies and a peak at about 533 eV that is often attributed to —OH. ZnO samples are synthesized using PIM-1 and solution phase precursors reveal a peak at 533 eV and at about 532 eV that can be attributed to either chemically adsorbed O2 or it can result in the shift of the peak corresponding to oxygen vacancies due to similar origin as the shift of the most intense peak. On the other hand, previously, the peak at 532.6 eV is attributed to loosely bound oxygen on the surface due to $H_2O$ or OH groups bonded to metal.

The compound ZnO is a commonly used intrinsic n-type semiconductor material with a bandgap of 3.37 eV, for the detection of various gas molecules due to its low cost and non-toxicity in nature. When ZnO is exposed to an ambient atmosphere, oxygen molecules are adsorbed on the surface of ZnO and then ionize into oxygen species by capturing electrons from the conduction band, leading to the creation of a surface depletion layer, band bending in the direction of reducing electrons, increase in the potential barrier and thus increasing the sensor resistance. Upon exposure of the ZnO surface to a reductive gas such as ethanol, the oxygen species will react with these ethanol gas molecules, leading to the formation of gaseous $CO_2$ and $H_2O$. Trapped electrons are released back to the conduction band, band bending is reduced, depletion width and the potential barrier for electron transport decreases, resulting in a decrease in the sensor resistance. Typically elevated temperatures (350° C.) are required to achieve a reduction in resistance. Previously, nanoporous ZnO enables significantly higher sensitivity at much lower temperatures (down to room temperature). Therefore, the resistivity changes in response to ethanol vapors at room temperature.

The gas sensing tests for the synthesized porous ZnO films are conducted in a custom-made vacuum chamber. The chamber is equipped with a 4-point probe and a QCM to simultaneously measure the change in electrical resistance and change in QCM resonant frequency during exposure to ethanol. The resonant frequency shift is directly proportional to the mass of ethanol adsorbed. Changes in the electrical conductivity and QCM frequency of the prepared ZnO films are also analyzed. Comparison of the resistance change and mass change can help to estimate the surface accessibility and sensitivity of the synthesized porous ZnO coatings.

For consistency in comparison, the samples synthesized with 5 cycles of SIS and adjusted the concentrations of $Zn(acac)_2$ in ethanol provide adsorption of similar concentrations of zinc oxide precursors. Thus, 0.5 wt. % and 1 wt. % concentrations of $Zn(acac)_2$ are used for PIM-1 and PS-P4VP (25-25), respectively. Note, that 5 cycle of SIS results in the infiltration of different amount of zinc oxide precursors into PIM-1 and PS-P4VP templates (as depicted in FIGS. 8a-f). Therefore, the direct comparison of the sensing performance for the samples synthesized are used with the same type of polymers because optimizing the concentration of $Zn(acac)_2$ provide a synthesis of the amount of synthesized ZnO similar to 5 SIS cycles. However, the mass change and resistivity responses are normalized to compare the performance of ZnO synthesized with different templates. The summary of the sensing results for the SBI-prepared ZnO films compared to the SIS at room temperature is shown in FIGS. 13a-l. The pressure increase in the pressure-time graph depicts the inflow of ethanol into the chamber. The pressure drop is indicative of ethanol evacuation from the chamber. All ZnO sensors demonstrate an increase in mass and decrease in resistance. The ZnO samples synthesized with PS-P4VP(25-25) demonstrate a more than two times higher mass increase upon their exposure to the ethanol vapors as compared to ZnO synthesized with PIM-1. ZnO films obtained by infiltration of PIM-1 with gas-phase precursors reveal the worst performance, while infiltration of PIM-1 using solution-phase result in similar resistivity change to ZnO samples obtained using solution-phase infiltration of PS-P4VP(25-25) that demonstrate about 2.5 higher change in mass measured in QCM experiments (as depicted in FIGS. 13a-l). These results demonstrate that ZnO synthesized with solution-phase precursor using PS-P4VP has a more accessible surface to ethanol molecules; however, the surface of ZnO film obtained using PIM-1 and solution phase precursor is better suited for decomposition ethanol. Both higher performing ZnO samples are highly crystalline, while samples with lower crystallinity demonstrate lower performance. In fact, samples with the smaller size of the crystallites reveal the worst results in terms of their resistivity change upon their exposure to ethanol. Therefore, the higher crystallinity of ZnO is associated with more robust and pronounced resistivity change. Smaller mass change of ZnO obtained with PS-P4VP(25-25) and gas-phase precursor as compared to ZnO synthesized using the same polymer template, but with solution-phase precursors indicates that the presence of $Zn(acac)_2$ in ethanol can also affect the swelling of BCP and can favor more complete micelle opening in spin-coated BCP resulting in the synthesis of ZnO with a more accessible surface.

In conclusion, the effect of the polymer support in the synthesis of the porous conformal inorganic coatings uses the polymer to template the structure of inorganic material, and two types of polymers can have a different mechanism of nucleation with metal oxide precursors such as PIM-1 and PS-P4VP (25-25) using the synthesis of ZnO as a model system. The infiltration of polymer templates can be demonstrated as efficiently achieved using both gas phase and solution phase precursors. Although not wanting to be bound by theory, the crystallinity of the synthesized ZnO is mainly affected by the state of the precursor (gas or solution phase) and does not depend on the polymer template type. Thus, the infiltration of polymer templates using solution-phase precursors (e.g. $Zn(acac)_2$) enables higher crystallinity as compared to samples obtained using gas-phase precursors (so-called SIS or VPI). The concentration of the metal salt in the solution can be matched to achieve the amount of metal oxide comparable with the amount synthesized via SIS or VPI. All synthesized samples reveal the promising potential for sensing at room temperature. Also, more crystalline ZnO conformal films synthesized with solution-phase precursors demonstrate better performance in ethanol sensing tests as compared to samples synthesized with gas-phase precursors. The surface of porous ZnO synthesized with BCP (here PS-P4VP) is more accessible than the surface of ZnO synthesized with PIM. However, despite the lower surface accessibility for ethanol molecules, ZnO synthesized via infiltration of PIM-1 with solution-phase precursors demonstrate the largest change in resistivity upon its exposure to ethanol vapor. Therefore, the solution and gas-phase infiltrations are approaches for the synthesis of uniform metal oxide or mixed metal oxide porous conformal coatings. The surface of the synthesized metal oxide can depend on the type of the polymer template that, in turn, can affect their properties (e.g. biofilm growth, catalytic, etc.). The results open the access to the synthesis of conformal metal oxide where gas-phase precursors are not available, or gas phase precursors can be available at high temperatures at which polymer template undergoes glass phase transition or deteriorates.

Additional advantages may be apparent to one of skill in the art viewing this disclosure. Having described various systems and methods herein, certain embodiments can include, but are not limited to:

In a first aspect, a method of forming an inorganic film on a surface comprises: depositing a polymer at a layer on the surface; swelling the polymer with a solvent to produce a swollen polymer on the surface; infiltrating the swollen polymer with a precursor; removing the swollen polymer after infiltrating the swollen polymer with the precursor; and forming a porous inorganic film on the surface based on removing the swollen polymer.

A second aspect that can include a method of forming an inorganic film on a surface of the first aspect, wherein the polymer comprises a block copolymer.

A third aspect that can include a method of forming an inorganic film on a surface of the first aspect or the second aspect, wherein the block copolymer comprises a polystyrene-block-polyvinyl pyridine, a polystyrene-block-polymethylmethacrylate, a UV-curable photoresist, a polymethylmethacrylate, a polymer of intrinsic microporosity, or any combination thereof.

A fourth aspect that can include a method of forming an inorganic film on a surface of any of the preceding aspects, wherein depositing the polymer on the surface comprises spin-coating a solution comprising the polymer on the surface.

A fifth aspect that can include a method of forming an inorganic film on a surface of any of the preceding aspects, wherein depositing the polymer on the surface comprises 3-D printing the polymer on the surface.

A sixth aspect that can include a method of forming an inorganic film on a surface of any of the preceding aspects, wherein swelling the polymer with the solvent comprises contacting the polymer with the solvent as a solution, wherein the solvent comprises methanol, ethanol, tetrahydrofuran, acetone, toluene, chloroform, or any combination thereof.

A seventh aspect that can include a method of forming an inorganic film on a surface of any of the preceding aspects, wherein infiltrating the swollen polymer with the precursor comprises using a gas phase precursor or a liquid phase precursor.

An eighth aspect that can include a method of forming an inorganic film on a surface of any of the preceding aspects, wherein the precursor comprises zinc, aluminum, or any combination thereof.

A ninth aspect that can include a method of forming an inorganic film on a surface of any of the preceding aspects, wherein the precursor comprises a metal.

A tenth aspect that can include a method of forming an inorganic film on a surface of any of the preceding aspects, wherein infiltrating the swollen polymer comprises contacting the swollen polymer with the precursor in a plurality of infiltration steps.

An eleventh aspect that can include a method of forming an inorganic film on a surface of any of the preceding aspects, wherein removing the swollen polymer comprises removing the swollen polymer under an oxidizing environment.

A twelfth aspect that can include a method of forming an inorganic film on a surface of any of the preceding aspects, wherein removing the swollen polymer comprises using UV ozone assisted removal of the polymer.

A thirteenth aspect that can include a method of forming an inorganic film on a surface of any of the preceding aspects, further comprises forming a sensor from the inorganic film on the surface; and detecting a presence of a compound using the sensor.

A fourteenth aspect that can include a method of forming an inorganic film on a surface of any of the preceding aspects, further comprises doping the porous inorganic film with one or more dopants.

A fifteenth aspect that can include a method of forming an inorganic film on a surface of any of the preceding aspects, wherein the one or more dopants comprise at least one of Al, Co, Cu, Fe, Mg, Mn, Pt, Pd, Ag, Au, or any combination thereof.

In a sixteenth aspect, a sensor comprises a porous inorganic film disposed on a surface, wherein the porous inorganic film comprises zinc oxide, and one or more sensor leads in electrical contact with the porous inorganic film.

A seventeenth aspect can include the sensor of the sixteenth aspect, wherein the surface comprises a silicon dioxide surface, a zinc oxide surface, or any combination thereof.

An eighteenth aspect can include the sensor of the sixteenth aspect or the seventeenth aspect, wherein the zinc oxide comprises OH groups at the surface of the zinc oxide.

A nineteenth aspect can include the sensor of any the sixteenth aspect to the eighteenth aspect, wherein the porous inorganic film has a thickness between about 140 nm to about 420 nm.

A twentieth aspect can include the sensor of any the sixteenth aspect to the nineteenth aspect, wherein the porous inorganic film has a porosity between about 50% and 70%.

A twenty-first aspect can include the sensor of any the sixteenth aspect to the twentieth aspect, wherein a pore size of the porous inorganic film is less than about 5 nm, or less than about 2 nm.

A twenty-second aspect can include the sensor of any the sixteenth aspect to the twenty-first aspect, wherein the inorganic film comprises one or more dopants.

A twenty-third aspect can include the sensor of any the sixteenth aspect to the twenty-second aspect, wherein the one or more dopants comprise at least one of Al, Co, Cu, Fe, Mg, Mn, Pt, Pd, Ag, Au, or any combination thereof.

For purposes of the disclosure herein, the term "comprising" includes "consisting" or "consisting essentially of" Further, for purposes of the disclosure herein, the term "including" includes "comprising," "consisting," or "consisting essentially of."

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the embodiments of the present invention. The discussion of a reference in the Description of Related Art is not an admission that it is prior art to the present invention, especially any reference that may have a publication date after the priority date of this application. The disclosures of all patents, patent applications, and publications cited herein are hereby incorporated by reference, to the extent that they provide exemplary, procedural or other details supplementary to those set forth herein.

While embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_L$, and an upper limit, $R_U$, is disclosed, any number falling within the range is specifically disclosed. In particular, the following numbers within the range are specifically disclosed: $R=R_L+k^*(R_U-R_L)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

From reading the present disclosure, other variations and modifications will be apparent to persons skilled in the art. Such variations and modifications may involve equivalent and other features which are already known in the art, and which may be used instead of or in addition to features already described herein.

We claim:

1. A method of forming an inorganic film on a surface, the method comprising:
   depositing a polymer at a layer on the surface;
   swelling the polymer with a solvent to produce a swollen polymer template on the surface;
   infiltrating the swollen polymer template with a liquid phase precursor;
   removing the swollen polymer template after infiltrating the swollen polymer template with the liquid phase precursor; and
   forming a porous inorganic film on the surface based on removing the swollen polymer template; and
   forming a sensor from the porous inorganic film on the surface.

2. The method of claim 1, wherein the polymer comprises a block copolymer.

3. The method of claim 2, wherein the block copolymer comprises a polystyrene-block-polyvinyl pyridine, a polystyrene-block-polymethylmethacrylate, a UV-curable photoresist, a polymethylmethacrylate, a polymer of intrinsic microporosity, or any combination thereof.

4. The method of claim 1, wherein depositing the polymer on the surface comprises:
   spin-coating a solution comprising the polymer on the surface.

5. The method of claim 1, wherein depositing the polymer on the surface comprises:

3-D printing the polymer on the surface.

6. The method of claim 1, wherein swelling the polymer with the solvent comprises contacting the polymer with the solvent as a solution, wherein the solvent comprises methanol, ethanol, tetrahydrofuran, acetone, toluene, chloroform, or any combination thereof.

7. The method of claim 1, wherein infiltrating the swollen polymer template with the liquid phase precursor further comprises using a gas phase precursor.

8. The method of claim 1, wherein the precursor comprises zinc, aluminum, cobalt, copper, iron, magnesium, platinum, palladium, silver, gold, or any combination thereof.

9. The method of claim 1, wherein the precursor comprises a metal.

10. The method of claim 1, wherein infiltrating the swollen polymer template comprises contacting the swollen polymer template with the precursor in a plurality of infiltration steps.

11. The method of claim 1, wherein removing the swollen polymer template comprises:

removing the swollen polymer template under an oxidizing environment.

12. The method of claim 11, wherein removing the swollen polymer template comprises:

using UV ozone assisted removal of the swollen polymer template.

13. The method of claim 1, further comprising:

detecting a presence of a compound using the sensor.

14. The method of claim 1, further comprising:

doping the porous inorganic film with one or more dopants.

15. The method of claim 14, wherein the one or more dopants comprise at least one of Al, Co, Cu, Fe, Mg, Mn, Pt, Pd, Ag, Au, or any combination thereof.

* * * * *